United States Patent
Yeh

(10) Patent No.: US 7,106,625 B2
(45) Date of Patent: Sep. 12, 2006

(54) CHARGE TRAPPING NON-VOLATILE MEMORY WITH TWO TRAPPING LOCATIONS PER GATE, AND METHOD FOR OPERATING SAME

(75) Inventor: Chih Chieh Yeh, Taipei (TW)

(73) Assignee: Macronix International Co, td, Hsinchu (TW)

( * ) Notice: Subject to any disclaimer, the term of this patent is extended or adjusted under 35 U.S.C. 154(b) by 1 day.

(21) Appl. No.: 11/085,326

(22) Filed: Mar. 21, 2005

(65) Prior Publication Data

US 2006/0007741 A1    Jan. 12, 2006

Related U.S. Application Data

(60) Provisional application No. 60/585,658, filed on Jul. 6, 2004, provisional application No. 60/585,657, filed on Jul. 6, 2004.

(51) Int. Cl.
*G11C 16/04* (2006.01)

(52) U.S. Cl. ............... 365/185.03; 365/185.27; 365/185.28; 365/185.29

(58) Field of Classification Search ............ None
See application file for complete search history.

(56) References Cited

U.S. PATENT DOCUMENTS

| | | | |
|---|---|---|---|
| 4,959,812 A | 9/1990 | Momodomi et al. | |
| 5,270,969 A | 12/1993 | Iwahashi | |
| 5,278,439 A * | 1/1994 | Ma et al. | 257/319 |
| 5,355,464 A | 10/1994 | Fandrich et al. | |
| 5,408,115 A | 4/1995 | Chang | |
| 5,424,569 A | 6/1995 | Prall | |
| 5,448,517 A | 9/1995 | Iwahashi | |
| 5,483,486 A | 1/1996 | Javanifard et al. | |
| 5,485,422 A | 1/1996 | Bauer et al. | |
| 5,509,134 A | 4/1996 | Fandrich et al. | |
| 5,515,324 A | 5/1996 | Tanaka | |
| 5,566,120 A | 10/1996 | D'Souza | |
| 5,602,775 A | 2/1997 | Vo | |
| 5,644,533 A | 7/1997 | Lancaster et al. | |
| 5,694,356 A | 12/1997 | Wong et al. | |
| 5,745,410 A | 4/1998 | Yiu et al. | |
| 5,753,950 A * | 5/1998 | Kojima | 257/315 |

(Continued)

FOREIGN PATENT DOCUMENTS

JP    09162313    6/1997

(Continued)

OTHER PUBLICATIONS

U.S. Appl. No. 10/855,286, filed May 26, 2004, entitled "Nand-Type Non-Volatile Memory Cell and Method for Operating Same," 15 pages.

(Continued)

*Primary Examiner*—Son Mai
(74) *Attorney, Agent, or Firm*—Mark A. Haynes; Haynes, Beffel & Wolfeld LLP

(57) ABSTRACT

A multiple-gate memory cell comprises a semiconductor body and a plurality of gates arranged in series on the semiconductor body. A charge storage structure on the semiconductor body includes two charge trapping locations beneath each of all or some of the gates in the plurality of gates. Circuitry to conduct source and drain bias voltages to the semiconductor body near a first gate and a last gate in the series, and circuitry to conduct gate bias voltages to the plurality of gates are included. The multiple-gate memory cell includes a continuous, multiple-gate channel region beneath the plurality of gates in the series, with charge storage locations between some or all of the gates.

25 Claims, 27 Drawing Sheets

U.S. PATENT DOCUMENTS

| | | | |
|---|---|---|---|
| 5,768,192 | A | 6/1998 | Eitan |
| RE35,838 | E | 7/1998 | Momodomi et al. |
| 5,895,949 | A | 4/1999 | Endoh et al. |
| 5,966,603 | A | 10/1999 | Eitan |
| 6,011,725 | A | 1/2000 | Eitan |
| 6,034,896 | A | 3/2000 | Ranaweera et al. |
| 6,074,917 | A | 6/2000 | Chang et al. |
| 6,096,603 | A | 8/2000 | Chang et al. |
| 6,151,248 | A * | 11/2000 | Harari et al. ......... 365/185.14 |
| 6,172,907 | B1 | 1/2001 | Jenne |
| 6,194,272 | B1 | 2/2001 | Sung |
| 6,215,148 | B1 | 4/2001 | Eitan |
| 6,219,276 | B1 | 4/2001 | Parker |
| 6,297,096 | B1 | 10/2001 | Boaz |
| 6,320,786 | B1 | 11/2001 | Chang et al. |
| 6,363,013 | B1 | 3/2002 | Lu et al. |
| 6,396,741 | B1 | 5/2002 | Bloom et al. |
| 6,436,768 | B1 | 8/2002 | Yang et al. |
| 6,458,642 | B1 | 10/2002 | Yeh et al. |
| 6,487,114 | B1 | 11/2002 | Jong et al. |
| 6,512,696 | B1 | 1/2003 | Fan et al. |
| 6,522,585 | B1 * | 2/2003 | Pasternak ............. 365/185.21 |
| 6,538,923 | B1 | 3/2003 | Parker |
| 6,552,386 | B1 | 4/2003 | Wu |
| 6,566,699 | B1 | 5/2003 | Eitan |
| 6,587,903 | B1 | 7/2003 | Roohparvar |
| 6,614,070 | B1 | 9/2003 | Hirose et al. |
| 6,614,694 | B1 | 9/2003 | Yeh et al. |
| 6,643,181 | B1 | 11/2003 | Sofer et al. |
| 6,643,185 | B1 | 11/2003 | Wang et al. |
| 6,645,813 | B1 * | 11/2003 | Hsieh ........................ 438/257 |
| 6,646,924 | B1 | 11/2003 | Tsai et al. |
| 6,657,894 | B1 | 12/2003 | Yeh et al. |
| 6,670,240 | B1 | 12/2003 | Ogura et al. |
| 6,670,671 | B1 | 12/2003 | Sasago et al. |
| 6,690,601 | B1 | 2/2004 | Yeh et al. |
| 6,714,457 | B1 | 3/2004 | Hsu et al. |
| 6,798,012 | B1 * | 9/2004 | Ma et al. ..................... 257/315 |
| 6,829,175 | B1 | 12/2004 | Tsai et al. |
| 6,856,551 | B1 * | 2/2005 | Mokhlesi et al. ...... 365/185.28 |
| 6,885,044 | B1 * | 4/2005 | Ding ........................ 257/202 |
| 6,912,163 | B1 | 6/2005 | Zheng et al. |
| 6,933,555 | B1 * | 8/2005 | Hsieh ........................ 257/314 |
| 6,937,511 | B1 | 8/2005 | Hsu et al. |
| 2002/0167844 | A1 | 11/2002 | Han et al. |
| 2002/0179958 | A1 | 12/2002 | Kim |
| 2003/0036250 | A1 | 2/2003 | Lin et al. |
| 2003/0185055 | A1 | 10/2003 | Yeh et al. |
| 2004/0084714 | A1 | 5/2004 | Ishii et al. |
| 2004/0145024 | A1 | 7/2004 | Chen et al. |
| 2005/0001258 | A1 | 1/2005 | Forbes |
| 2006/0044872 | A1 * | 3/2006 | Nazarian ............... 365/185.17 |

FOREIGN PATENT DOCUMENTS

| | | |
|---|---|---|
| JP | 11233653 | 8/1999 |
| WO | WO 94/28551 | 12/1994 |

OTHER PUBLICATIONS

U.S. Appl. No. 11/085,458, filed Mar. 21, 2005, entitled "Charge Trapping Non-Volatile Memory and Method for Gate-by-Gate Erase for Same," 73 pages.

U.S. Appl. No. 11/085,325, filed Mar. 21, 2005, entitled "Memory Array Including Multiple-Gate Charge Trapping Non-Volatile Cells," 74 pages.

U.S. Appl. No. 11/085,300, filed Mar. 21, 2005, entitled "Charge Trapping Non-Volatile Memory and Method for Operating Same," 73 pages.

U.S. Appl. No. 60/585,658, filed Jul. 6, 2004, entitled "Charge Trapping Non-Volatile Memory Cell and Method of Operating Same," 26 pages.

U.S. Appl. No. 11/085,444, filed Mar. 21, 2005, entitled "Method for Manufacturing a Multiple-Gate Charge Trapping Non-Volatile Memory," 71 pages.

U.S. Appl. No. 11/118,839, filed Apr. 29, 2005, entitled "Inversion Bit Line, Charge Trapping Non-Volatile Memory and Method of Operating Same," 34 pages.

Chang, Kuo-Tung, et al., "A New SONOS Memory Using Source-Side Injection for Programming," IEEE Electron Device Letters, vol. 19, No. 7, Jul. 1998, 253-255.

Eitan, Boaz, et al., "NROM: A Novel Localized Trapping, 2-Bit Nonvolatile Memory Cell," IEEE Electron Device Letters, vol. 21, No. 11, Nov. 2000, 543-545.

Fujiwara, I., et al., "0.13 µm MONOS single transistor memory cell with separated source lines," IEDM 1998, 995-998.

Kobayashi, T., et al., "A Giga-Scale Assist-Gate (AG)-AND-Type Flash Memory Cell with 20-MB/s Programming Throughput for Content-Downloading Applications," IEDM 2001, 2.2.1-2.2.4.

Naruke, K., et al., "Nonvolatile Semiconductor Memories: Technologies, design and application," C. Hu. Ed., New York, IEEE Press, 1991, Ch. 5, pp. 183-186.

Sasago, Y., et al., "90-nm-node multi-level AG-AND type flash memory with cell size of true 2 F2/bit and programming throughput of 10MB/s," IEEE, 2003, 4 pages.

Bude, J.D., et al. "Secondary Electron Flash—a High Performance, Low Power Flash Technology for 0.35 µm and Below," Electron Devices Meeting, 1997. Technical Digest, International, Dec. 7-10, 1997, 279-282.

Chung, Steve S., et al., "A Novel Leakage Current Separation Technique in a Direct Tunneling Regime Gate Oxide SONOS Memory Cell," Electron Devices Meeting, 2003. IEDM '03 Technical Digest. IEEE International, Dec. 8-10, 2003 pp. 26.6.1-26.6.4.

Chung, Steve S., "Low Voltage/Power and High Speed Flash Memory Technology for High Performance and Reliability," The 3rd WIMNACT—Singapore, Oct. 15, 2003, 1-48.

De Blauwe, Jan, "Nanocrystal Nonvolatile Memory Devices," IEEE Transactions on Nanotechnology, vol. 1, No. 1, Mar. 2002, 72-77.

Eitan, Boaz, "Can NROM, a 2-bit, Trapping Storage NVM Cell, Give a Real Challenge to Floating Gate Cells?" SSDM, Tokyo, Japan (1999), 3 pages.

Hirose, M., "Challenges for Future Semiconductor Development," Microprocesses and Nanotechnology Conference, 2002. Digest of Papers. Microprocesses and Nanotechnology 2002. 2002 International, Nov. 6-8, 2002, pp. 2-3, plus 24 pages from outline.

Huff, H.R. and Bevan, M., assemblers, "Questions at the International Workshop on Gate Insulators," Ad Hoc Meeting on High-k Gate Dielectrics at the Semiconductor Interface Specialists Conference, Nov. 30, 2001, 3 pages.

Janai, Meir, "Data Retention, Endurance and Acceleration Factors of NROM Devices," IEEE 41st Annual International Reliability Physics Symposium, Dallas, Texas, 2003, 502-505.

Lee, Chang Hyun, et al. "A Novel SONOS Structure of SiO2/SiN/Al2O3 with TaN Metal Gate for Multi-Giga Bit Flash Memories," Electron Devices Meeting, 2003. IEDM '03 Technical Digest. IEEE International, Dec. 8-10, 2003, 26.5.1-26.5.4.

Lee, Changhyun, et al., "A Novel Structure of SiO2/SiN/High k Dielectrics, Al2O3 for SONOS Type Flash Memory," Extended Abstracts of the 2002 International Conference on Solid State Devices and Materials, Sep. 17-19, 2002, Nagoya, 162-163.

Lee, Jae-Duk, et al., "Effects of Floating-Gate Interference on NAND Flash Memory Cell Operation," IEEE Electron Device Letters, vol. 23, No. 5, May 2002, 264-266.

Liu, Zhizheng, et al., "A New Programming Technique for Flash Memory Devices," International Symposium on VLSI Technology, Systems and Applications, Jun. 8-10, 1999, 195-198.

Lusky, Eli et al., "Electron Discharge Model of Locally-Trapped Charge in Oxide-Nitride-Oxide (ONO) Gates for NROM Non-Volatile Semiconductor Memory Devices," SSDM, Tokyo, Japan (Sep. 2001), 2 pages.

Lusky, Eli et al., "Spatial characterization of Channel hot electron injection Utilizing subthreshold slope of the localized charge storage NROM memory device," Non-Volatile Semiconductor Memory Workshop, Monterey, CA (Aug. 2001) 2 pages.

Shin, Yoocheol, et al., "High Reliable SONOS-type NAND Flash Memory Cell with Al2O3 for Top Oxide," Non-Volatile Semiconductor Memory Workshop, 2003, 2 pages.

Tsai, W.J., et al., "Data Retention Behavior of a SONOS Type Two-Bit Storage Flash Memory Cell," Electron Devices Meeting, 2001. IEDM Technical Digest International, Dec. 2-5, 2001 pp. 32.6.1-32.6.4.

Wang, Tahui, et al., "Reliability Models of Data Retention and Read-Disturb in 2-bit Nitride Storage Flash Memory Cells," Electron Devices Meeting, 2003. IEDM '03 Technical Digest. IEEE International, Dec. 8-10, 2003, pp. 7.4.1-7.4.4.

White, Marvin, H., et al., "On the Go with SONOS," Circuits and Devices Magazine, IEEE, vol. 16, Issue: 4, Jul. 2000, pp. 22-31.

Yeh, C.C., et al., "Novel Operation Schemes to Improve Device Reliability in a Localized Trapping Storage SONOS-type Flash Memory," Electron Devices Meeting, 2003. IEDM '03 Technical Digest. IEEE International, Dec. 8-10, 2003, pp. 7.5.1-7.5.4.

Yeh, C.C., et al., "Phines: A Novel Low Power Program/Erase, Small Pitch, 2-Bit per Cell Flash Memory," Electron Devices Meeting, 2002. IEDM '02. Digest. International, Dec. 8-11, 2002, pp. 931-934.

Lahiri, S. K., "MNOS/Floating-Gate Charge Coupled Devices for High Density EEPROMS: A New Concept", Physics of Semiconductor Devices, Dec. 1997, pp. 951-956, vol. 3316, No. 2.

\* cited by examiner

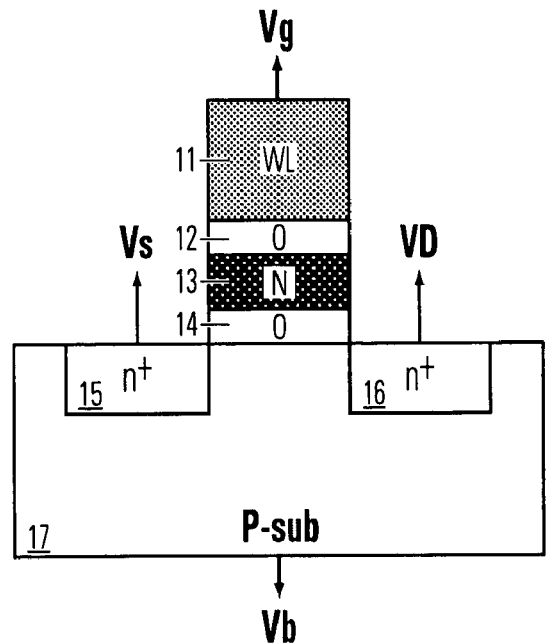
FIG. 1 (Prior Art)
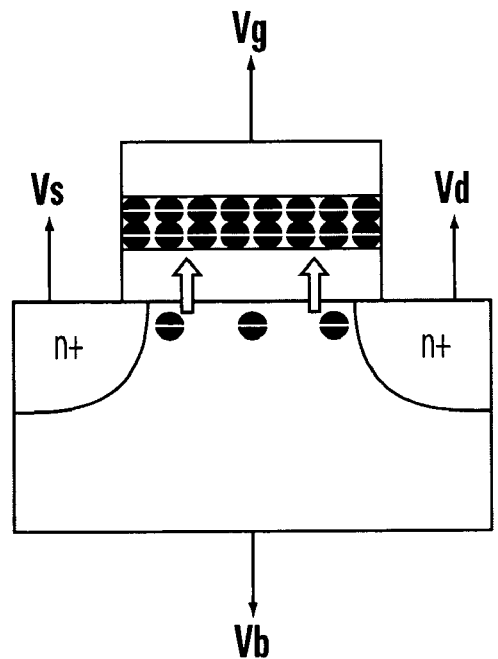
FIG. 2A (Prior Art)
FIG. 2B (Prior Art)

CHARGE TRAPPING NON-VOLATILE MEMORY WITH TWO TRAPPING LOCATIONS PER GATE, AND METHOD FOR OPERATING SAME

RELATED APPLICATIONS

This application claims the benefit of U.S. Provisional Application Ser. No. 60/585,658 filed 6 Jul. 2004; and of U.S. Provisional Application Ser. No. 60/585,657 filed 6 Jul. 2004.

BACKGROUND OF THE INVENTION

1. Field of the Invention

The present invention relates to integrated circuit non-volatile memory devices, and more particularly to a novel memory cell and operating method for such device.

2. Description of Related Art

Electrically programmable and erasable non-volatile memory technologies known as EEPROM and flash memory based on charge storage are used in a variety of modern applications. A number of memory cell structures are used for EEPROM and flash memory. As the dimensions of integrated circuits shrink, greater interest is arising in memory cell structures based on charge trapping dielectric layers, because of the scalability and simplicity of the manufacturing processes. Memory cell structures based on charge trapping dielectric layers include structures known by the industry names NROM, SONOS, MONOS and PHINES, for example. These memory cell structures store data by trapping charge in a charge trapping dielectric layer, such as silicon nitride. As negative charge is trapped, the threshold voltage of the memory cell increases. The threshold voltage of the memory cell is reduced by removing negative charge from the charge trapping layer.

FIG. 1 is a simplified diagram of a prior art SONOS-type charge trapping memory cell. The substrate includes $n^+$-doped regions that act as source and drain terminals 15 and 16, and a p-doped channel region 17 between the terminals 15 and 16. The remainder of the memory cell includes a charge trapping structure including bottom dielectric 14 on the substrate, a charge trapping material 13 on the bottom dielectric 14, a top dielectric 12 on the charge trapping material 13, and a gate 11 on the top dielectric 12. Representative top dielectrics include silicon dioxide and silicon oxynitride having a thickness of about 5 to 0.10 nanometers, or other similar high dielectric constant materials including for example $Al_2O_3$. Representative bottom dielectrics include silicon dioxide and silicon oxynitride having a thickness of about 3 to 10 nanometers, or other similar high dielectric constant materials. Representative charge trapping materials for this type of charge trapping structure include silicon nitride having a thickness of about 3 to 9 nanometers, or other similar high dielectric constant materials, including silicon oxynitride, metal oxides such as $Al_2O_3$, $HfO_2$, and others. The charge trapping material may be a discontinuous set of pockets or particles of charge trapping material, or a continuous layer as shown in the drawings.

The terminals 15, 16 for the memory cell act as source and drain in the bias arrangements used for reading, programming and erasing the memory cells. The doped regions, forming terminals 15, 16, typically comprise impurities that are implanted into the semiconductor substrate to establish conductive terminals having a conductivity type which is the opposite of that in the channel region 17. The procedures for implanting the impurities that result in diffusion of the implanted impurities into the semiconductor substrate can limit the ability to shrink the length of the channel between the terminals 15 and 16, even as the minimum dimensions achievable using lithography shrink.

FIG. 2A and FIG. 2B illustrate one bias arrangement in the prior art that induces Fowler-Nordheim tunneling from the substrate into the charge trapping structure, for programming a memory cell to a high threshold state. FIG. 2A is a table showing the bias voltages on the gate Vg, source Vs, drain Vd and substrate Vb, which result in electron tunneling as illustrated in FIG. 2B, according to this prior art arrangement.

FIG. 3 shows prior art SONOS-type cells arranged in series for a NAND-type array structure, with a bias arrangement illustrated for programming a selected cell. The series of cells in FIG. 3 comprises $n^+$ doped regions 20–26, select gates SLG1 and SLG2, and word lines $WL_1$–$WL_4$. Charge storage structures 27–30 are provided beneath the word lines $WL_1$–$WL_4$, and over channel regions 31–34 between the doped regions 21 and 22, doped regions 22 and 23, doped regions 23 and 24, and doped regions 24 and 25 respectively. Doped regions 20 and 26 act as bit lines or contacts for bit lines $BL_1$ and $BL_2$, respectively. The select transistors formed by the select gates SLG1 and SLG2, doped regions 20 and 21, and doped regions 25 and 26, respectively, act to connect the series of memory cells to, or isolate the series of memory cells from, the bit lines $BL_1$ and $BL_2$. In order to program a selected memory cell in the series, such as the memory cell at $WL_1$, a bias arrangement is applied as illustrated in which $BL_1$ is coupled either to ground (to program the selected cell by FN injection) or to a supply potential Vcc (to inhibit programming of the selected cell). The select gate SLG1 receives the supply potential Vcc in order to couple the bit line $BL_1$ to the doped region 21. The select gate SLG2 receives zero volts or ground in order to isolate the bit line $BL_2$ from the doped region 25. The word line of the selected cell, $WL_1$ in this example, receives a high-voltage of about 18V, while the substrate is grounded. The word lines of unselected cells receive a voltage of about 10V, which is sufficient to induce inversion in their respective channel regions, but insufficient to cause significant charge injection. As shown in FIG. 3, a doped region is formed between each channel region.

Thus, one limitation on the size of traditional memory cells arises from the use of diffusion lines in semiconductor substrates for source and drain terminals. The diffusion of impurities used to form the diffusion lines spreads out beyond the locations in which the implant is made, increasing the size of the doped region and causing other limitations on cell size, including minimum channel lengths for prevention of punch-through.

One approach to overcoming the problems with use of diffusion lines has been developed based on inducing conductive inversion regions in the substrate using control electrodes adjacent to the charge storage structure in the memory cell, so that the dynamically established inversion regions act as source and drain terminals. Because there are no implants, the dimensions of the inversion regions can be more precisely controlled according to the minimum feature sizes of the manufacturing process. See, Sasago et al., "90-nm-node multi-level AG-AND type flash memory with cell size of true $2F^2$/bit and programming throughput of 10 MB/s," IEDM, 2003, pages 823–826 and U.S. Patent Application Publication No. US 2004/0084714 by Ishii et al. The assist gate technique of Sasago et al. might be considered an extension of so called "split gate" technology applied to floating gate memory devices in a variety of forms. See, U.S. Pat. No. 5,408,115 by Chang for background related to split gate devices.

It is desirable to provide memory technology for nonvolatile memory that is easily manufactured and supports high-density applications.

SUMMARY OF THE INVENTION

An integrated circuit memory device based on multiple-gate memory cells is described. An embodiment of such a device comprises a semiconductor body and a plurality of gates arranged in series on the semiconductor body. A charge storage structure on the semiconductor body includes charge trapping locations beneath more than one of the gates in the plurality of gates. Circuitry to conduct source and drain bias voltages to first and second terminal locations in the semiconductor body near a first gate and a last gate, respectively, in the series, and circuitry to conduct gate bias voltages to the plurality of gates are included. The multiple-gate memory cell includes a continuous, multiple-gate channel region beneath the plurality of gates in the series, between the first and second terminal locations. In some embodiments, charge trapping locations are included beneath all of the gates in the series for a given multiple-gate memory cell, and all the gates are used as control gates for storage of data. In other embodiments, not all the gates in the series are used as control gates for storage of data. In one example, every other gate is used for a control gate for storage of data, while the other gates in the series are used to improve isolation between the storage locations in the memory cells.

In embodiments on the multiple-gate memory cell, data is stored in two locations beneath more than one, or all, of the gates in the plurality of gates in the series, whereby two storage locations are used per control gate for storage of data.

In embodiments, the circuitry to conduct source and drain bias voltages comprises conductive material arranged as bit lines, and the circuitry to conduct gate bias voltages comprises conductive material arranged as word lines. For example, first and second doped regions are included in the semiconductor body to provide terminal locations adjacent the first gate in the series and adjacent the last gate in the series. The doped regions have a conductivity type opposite that of the semiconductor body and act as source and drain terminals. In other embodiments, the first and second terminal locations are provided by inversion regions induced in the substrate during access to the storage locations in the multiple-gate memory cell. A device, such as a select transistor, is included in some embodiments to selectively connect the doped regions or inversion regions which act as at least one of the first and second terminal locations to bit lines.

Integrated circuit devices including multiple-gate memory cells can be implemented with controllers that control the circuitry to conduct source and drain bias voltages and the circuitry to conduct gate bias voltages, in order to establish bias arrangements for operating of the memory cell. Bias arrangements provided by the controller, in one example, include a program bias arrangement to induce electron injection tunneling into the charge trapping location beneath a selected gate in the series on the cell for establishing a high threshold state. During programming, selected gate bias voltages are applied to another control gate, or all other control gates, in the series sufficient to induce inversion in the channel region to support the electron tunneling. Bias arrangements provided by the controller, in examples including programming by electron injection include an erase bias arrangement to induce electron ejection or hole injection into the charge storage locations being erased, to establish a low threshold state.

In embodiments of integrated circuits including the multiple-gate memory cell, including embodiments utilizing two storage locations per control gate, a controller controls the circuitry to conduct source and drain bias voltages and the circuitry to conduct gate bias voltages to establish a bias arrangement for storing data in charge trapping locations beneath each of more than one of the plurality of gates in the series. Bias arrangements provided by the controller, in one example, include a program bias arrangement to induce hot hole injection tunneling into the charge trapping location in a selected one of the two charge storage locations beneath a selected gate in the series on the cell for establishing a low threshold state. During programming of a selected charge storage location beneath a selected control gate, bias voltages are applied to another gate, or all other gates, in the series sufficient to induce inversion in the channel region to support the hole tunneling. Bias arrangements provided by the controller, in examples including programming by hole injection, include an erase bias arrangement to induce electron injection into the charge storage locations being erased, to establish a high threshold state. In embodiments of integrated circuits including the multiple-gate memory cell, including embodiments utilizing two storage locations per control gate, a controller applies bias arrangements for erase, including hot hole erase in some embodiments, according to an erase procedure including erasing a storage location beneath a selected gate in the series in the multiple-gate memory cell, while not erasing a storage location beneath another gate in the series.

Bias arrangements provided by the controller, in some examples, include a read bias arrangement under which a selected control gate receives a read voltage, and the control gates over other storage locations receive a voltage to induce inversion in the multiple-gate channel region to support reading of the selected memory location.

A method for operating an integrated circuit memory device is also described, where the device comprises a multiple-gate memory cell as described above, and where the method is typically controlled by an on-chip controller. The method comprises applying a bias arrangement for reading data at a location beneath a selected gate, a bias arrangement for programming data at a location beneath a selected gate and a bias arrangement for erasing the data in the device. In embodiments of the method, the bias arrangement for programming includes:

applying a substrate bias condition to the semiconductor body in the multiple-gate channel region;

applying a source bias condition to the semiconductor body near one of the first and last gates in the series;

applying a drain bias condition to the semiconductor body near another of the first and last gates in the series; and applying gate bias conditions to the plurality of gates in the series, wherein the gate bias conditions include a program voltage relative to the substrate bias condition on a selected gate in the series sufficient to induce electron injection current into a charge trapping location beneath the selected gate to establish a high threshold state, and inversion voltages on other gates in the series sufficient to induce inversion in the multiple-gate channel region beneath said other gates without significant electron injection into charge storage locations beneath said other gates.

In embodiments of the method, the bias arrangement for erasing includes:

applying a substrate bias condition to the semiconductor body in the multiple-gate channel region;

applying a source bias condition to the semiconductor body near one of the first and last gates in the series;

applying a drain bias condition to the semiconductor body near another of the first and last gates in the series; and applying gate bias conditions to the plurality of gates in the series, wherein the gate bias conditions include voltages sufficient to induce electron ejection or hole injection, from the charge trapping locations beneath the gates in the series to establish the low threshold state.

In another example, the bias arrangement for erasing includes:

applying a substrate bias condition to the semiconductor body in the multiple-gate channel region;

applying a source bias condition to the semiconductor body near one of the first and last gates in the series;

applying a drain bias condition to the semiconductor body near another of the first and last gates in the series; and applying gate bias conditions for erasing one or more selected locations beneath the plurality of gates in the series, wherein the gate bias conditions include voltages sufficient to induce hole injection to the charge trapping locations beneath a selected gate in the series and inversion voltages on other gates in the series sufficient to induce inversion in the multiple-gate channel region beneath said other gates, to establish a low threshold state in the selected gate.

Erase procedures according to embodiments of the method, include identifying a set of gates in the plurality of gates in the series to be erased, the set of gates having more than one member;

applying said gate bias conditions for erase for a first selected gate in the set of gates to induce one or both of source side and drain side band-to-band tunneling-induced hot hole injection to the charge storage location beneath the first selected gate; and applying said gate bias conditions for erase for a next selected gate in the set of gates to induce one or both of source side and drain side band-to-band tunneling-induced hot hole injection to the charge storage location beneath the next selected gate, and repeating until applying said gate bias conditions for erase to all the gates in the set.

In embodiments of the method, the bias arrangement for reading to determine data represented by high and low threshold states, includes:

applying a substrate bias condition to the semiconductor body in the multiple-gate channel region;

applying a source bias condition to the semiconductor body near one of the first and last gates in the series;

applying a drain bias condition to the semiconductor body near another of the first and last gates in the series; and applying gate bias conditions to the plurality of gates in the series, wherein the gate bias conditions include a read voltage relative to the substrate bias condition on a selected gate in the series, the read voltage being higher than a threshold voltage for the low threshold state, and inversion voltages on other gates in the series sufficient to induce inversion in the multiple-gate channel region beneath said other gates, the inversion voltages higher than the high threshold state.

Multiple gate memory cells as described herein are arranged in arrays including a plurality of word lines coupled to the plurality of gates of multiple-gate memory cells in at least one row; a plurality of bit lines, arranged orthogonally to the plurality of word lines, and arranged for connection to multiple-gate memory cells in one or more columns of the plurality of columns; a plurality of select gates arranged to connect respective multiple-gate memory cells in the at least one row to a corresponding bit line in the plurality of bit lines in response to a select gate control signal; and a select line coupled to the plurality of select gates in the at least one row to provide the select gate control signal. In addition, a controller controls the plurality of bit lines, plurality of word lines and the select line to conduct source and drain bias voltages to the multiple-gate memory cells in the array, and to conduct gate bias voltages to the plurality of gates in the multiple-gate memory cells in the at least one row, and to provide the select gate control signal.

Multiple-gate memory cells and arrays of multiple-gate memory cells as described herein are manufactured according to methods, in some embodiments, including providing a semiconductor body having a first conductivity type;

forming a charge storage structure on the semiconductor body;

depositing a first gate conductor layer over the charge storage structure;

patterning the first gate conductor layer to define a first plurality of gates over the charge storage structure, the first plurality of gates arranged in series with spaces between them over a continuous, multiple-gate channel region between a first terminal location and a second terminal location in the semiconductor body;

forming an isolation layer of material on at least sidewalls of the first plurality of gates;

depositing a second gate conductor layer over the isolation layer, including in the spaces between the first plurality of gates, and isolated from the first plurality of gates by the isolation layer; to define a second plurality of gates over the semiconductor body, the first plurality of gates and the second plurality of gates arranged in series over the continuous, multiple-gate channel region between the first terminal location and the second terminal location in the semiconductor body to form a multiple-gate memory cell.

In embodiments of the multiple-gate memory cells described herein, the gates in the series are separated from one another by small distances, set for examples manufactured as described in the previous paragraph, by a thickness of the isolation layer on the sidewalls of the control gates. Such distances are substantially less than the gate lengths in the continuous, multiple-gate channel, for the individual gates, including distances less than 100 nanometers.

Other aspects and advantages of the present invention can be seen on review of the drawings, the detailed description and the claims, which follow.

BRIEF DESCRIPTION OF THE DRAWINGS

FIG. 1 is a diagram of a prior art charge trapping memory cell.

FIGS. 2A and 2B illustrate a bias arrangement for programming a prior art charge trapping memory cell by inducing FN tunneling.

DETAILED DESCRIPTION

A detailed description of embodiments of the present invention is provided with reference to the FIGS. 4–51.

As generally used herein, programming refers to setting the threshold voltage of selected memory locations bit-by-bit, and erasing refers to setting the threshold voltage of a selected block of memory locations, or selected memory locations, to an "erase condition," including flash erase of an entire array or sector of an array. Data is written in embodiments of the invention by a procedure including, first, an erase process for a designated block to set the memory locations in the block to an erase threshold, which is typically one of a high or low threshold state, followed by a program process for memory locations in the block to set the selected memory locations to the program state, which is typically the other of the high or low threshold states, while leaving the unselected memory locations in the block in the erase state. Embodiments of the technology described herein include both products and methods where programming refers to raising the threshold voltage of a memory location and erasing refers to lowering the threshold voltage of a memory location, and products and methods where programming refers to lowering the threshold voltage of a memory location and erasing refers to raising the threshold voltage of a memory location.

Figure 3:
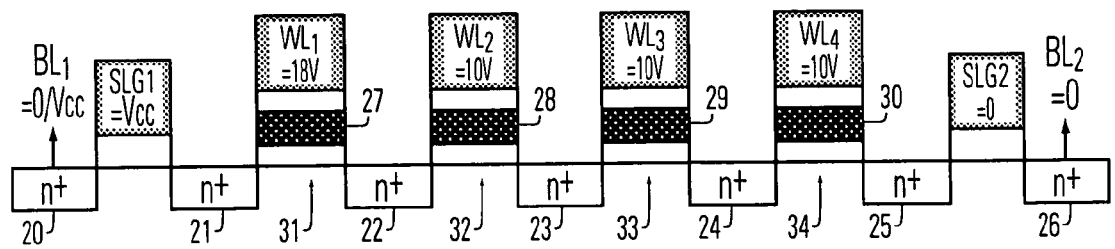
FIG. 3 illustrates a prior art arrangement of a series of charge trapping memory cells, in a series NAND configuration, with a bias arrangement for programming a selected cell in the series.
Figure 4:
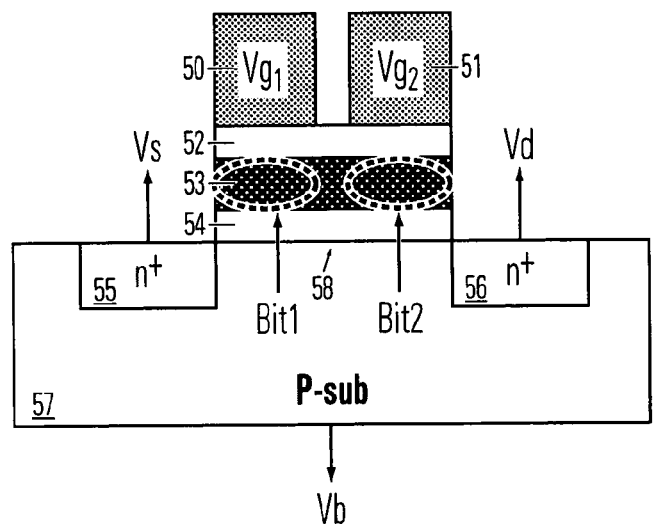
FIG. 4 illustrates a multiple-gate memory cell, having two control gates.

FIG. 4 illustrates a double gate memory cell according to the present invention, with a bias arrangement illustrated for programming a selected location. The double gate memory cell comprises terminals 55, 56 formed by n+ doped regions at terminal locations on the left and right, respectively, left and right gates 50, 51 and channel region 58 in the substrate 57. The doped regions serve as terminals 55, 56 to connect the double gate memory cell to bit lines, or other circuitry to supply bias voltages. The channel region 58 is a continuous p-type region in the substrate between the terminals 55 and 56, notably without a doped region separating the segments of channel regions beneath the left and right gates 50, 51. A charge storage structure including a top dielectric 52 such as silicon dioxide with a representative thickness of about 9 nm, a charge trapping layer 53, and a bottom dielectric 54 such as silicon dioxide with a representative thickness of about 6 nm, is formed between the gates 50, 51 and the channel region 58 in a p-type substrate. The charge trapping layer 53 comprises a layer of material such as silicon nitride about 6 nm thick, or other structure, that does not conduct trapped charge for a selected cell into regions that would substantially affect the threshold voltage of other locations in the series. In some embodiments, the gates 50, 51 comprise n-type or p-type polysilicon. Other representative gate materials include TiN, Pt, and other high work function metals and materials. Each of the storage locations can store one bit, or multiple bits, of data. Multiple bits can be stored for example in each location by establishing multiple program threshold levels for the locations.

Figure 5:
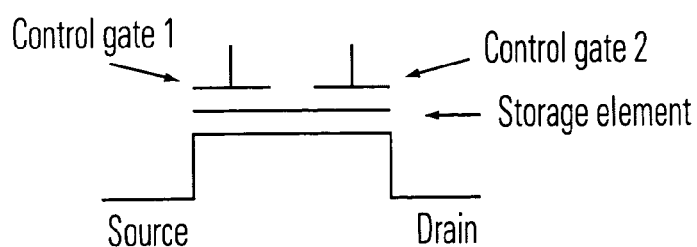
FIG. 5 is a schematic symbol for a multiple-gate memory cell like that of FIG. 4.

FIG. 5 shows a schematic symbol of a double gate memory cell, like that described with reference to FIG. 4, where the source and drain correspond with doped region terminals 55 and 56, respectively, and control gate 1 corresponds with gate 50, and control gate 2 corresponds with gate 51.

Figure 6:
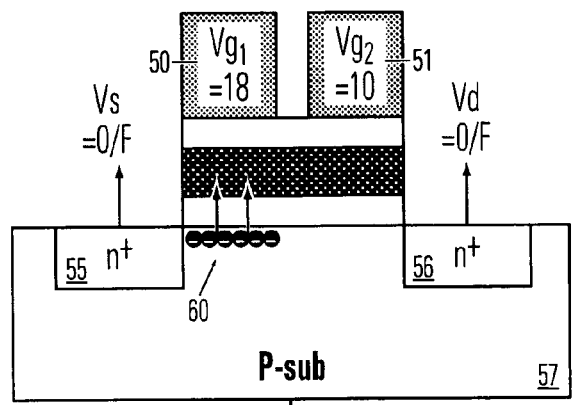
FIG. 6 illustrates a multiple-gate memory cell, having two control gates in series, with a bias arrangement for programming a storage location beneath a selected cell in the series.

FIG. 6 illustrates a bias arrangement for programming a selected memory location in a double gate memory cell, like that described with reference to FIG. 4. According to the bias arrangement, FN tunneling is induced in the location represented by the electron symbols 60 in the charge storage structure beneath gate 50, by grounding the substrate 57, applying $Vg_1$ of about 18 volts to gate 50, applying about 10 volts to gate 51, while one of the doped region terminals 55 and 56 is grounded and the other is either grounded or left floating.

Figure 7A:
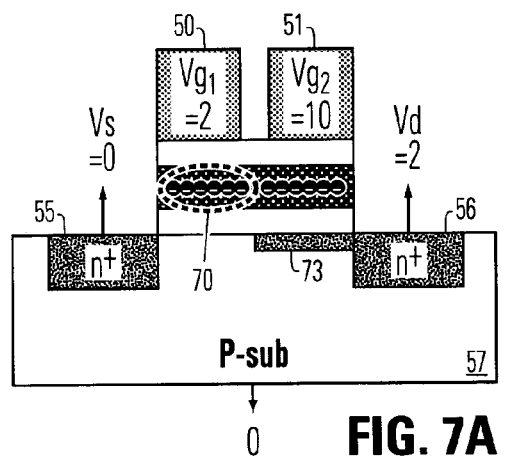
FIGS. 7A–7D show a multiple-gate memory cell, having two control gates in series, with respective bias arrangements for reading a storage location beneath a selected cell in the series.
Figure 7B:
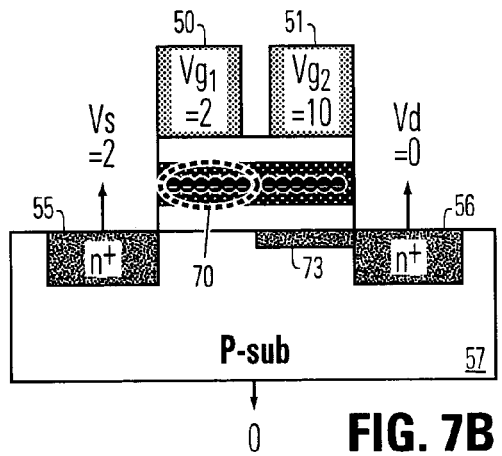
Figure 7C:
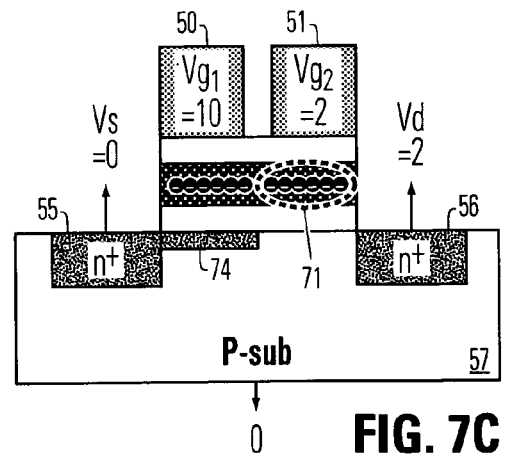
Figure 7D:
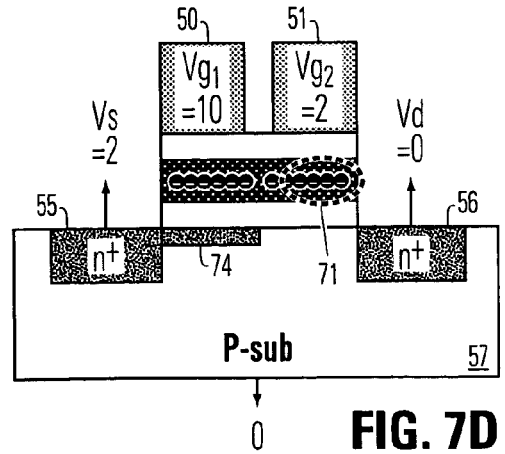

FIGS. 7A–7D illustrate bias arrangements for reading the data in a double-gate memory cell, like that described with reference to FIG. 4. In FIG. 7A and FIG. 7B, the data, corresponding with "bit 1" of the double gate memory cell, stored in a charge storage location 70 beneath the gate 50 receiving the gate voltage $Vg_1$, is read with either the source side or the drain side receiving 2 volts. In FIG. 7C and FIG. 7D, the data corresponding with "bit 2" of the double gate memory cell, stored in a charge storage location 71 beneath the gate 51 receiving the gate voltage $Vg_2$, is read with either the source side or the drain side receiving 2 volts.

FIG. 7A illustrates the bias arrangement for reading "bit 1" in the storage location 70 with terminal 56 acting as a drain with positive 2 Volts applied, and terminal 55 acting as a source with ground applied. The gate voltage $Vg_2$ applied to gate 51 is high enough to cause an inversion 73 in the channel region between the terminals 55 and 56. The inversion 73 induced by the gate voltage $Vg_2$ serves to couple the voltage at the drain or the source to the region in the channel near the storage location 70. The gate voltage $Vg_1$ applied to gate 50 is set above the low threshold state for the memory cell, and below the high threshold state. One example implementation applies a gate voltage $Vg_1$ of about 2 volts. FIG. 7B illustrates reading the same "bit 1" in the storage location 70 with a bias for terminal 56 and terminal 55 reversed.

FIG. 7C illustrates the bias arrangement for reading "bit 2" in the storage location 71 with terminal 56 acting as a drain with positive 2 Volts applied, and terminal 55 acting as a source with ground applied. The gate voltage $Vg_1$ applied to gate 50 is high enough to cause an inversion 74 in the channel region between the terminals 55 and 56. The inversion 74 induced by the gate voltage $Vg_1$ serves to couple the voltage at the drain or the source to the region in the channel near the storage location 71. The gate voltage $Vg_2$ applied to gate 51 is set above the low threshold state for the memory cell, and below the high threshold state. One example implementation applies a gate voltage $Vg_2$ of about 2 Volts. FIG. 7D illustrates reading the same "bit 2" in the storage location 71 with a bias for terminal 56 and terminal 55 reversed.

Figure 8:
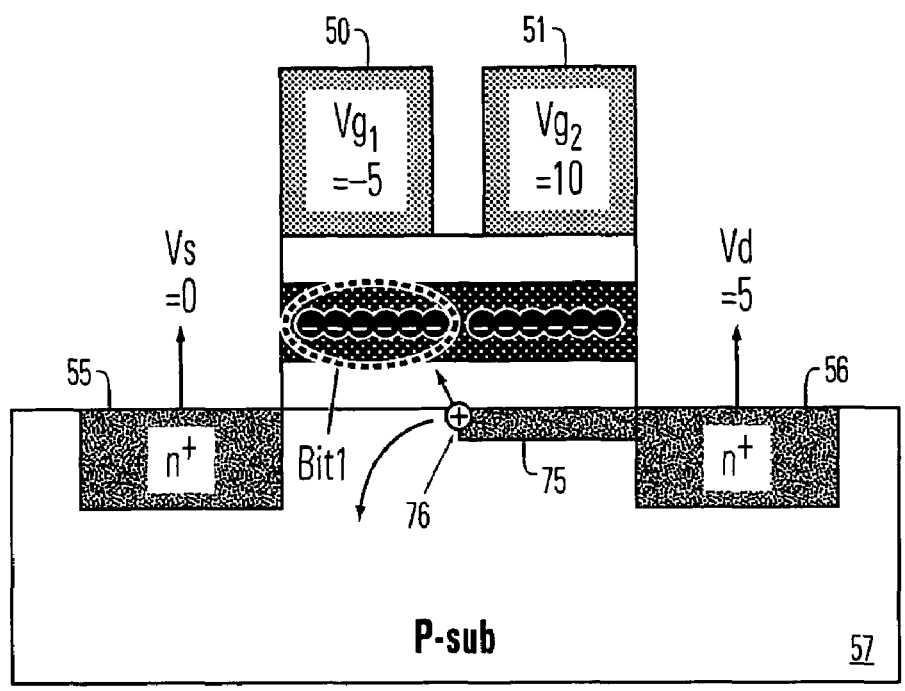
FIG. 8 illustrates a multiple-gate memory cell, having two control gates in series, with a bias arrangement for erasing a storage location beneath a selected cell in the series.
Figure 9:
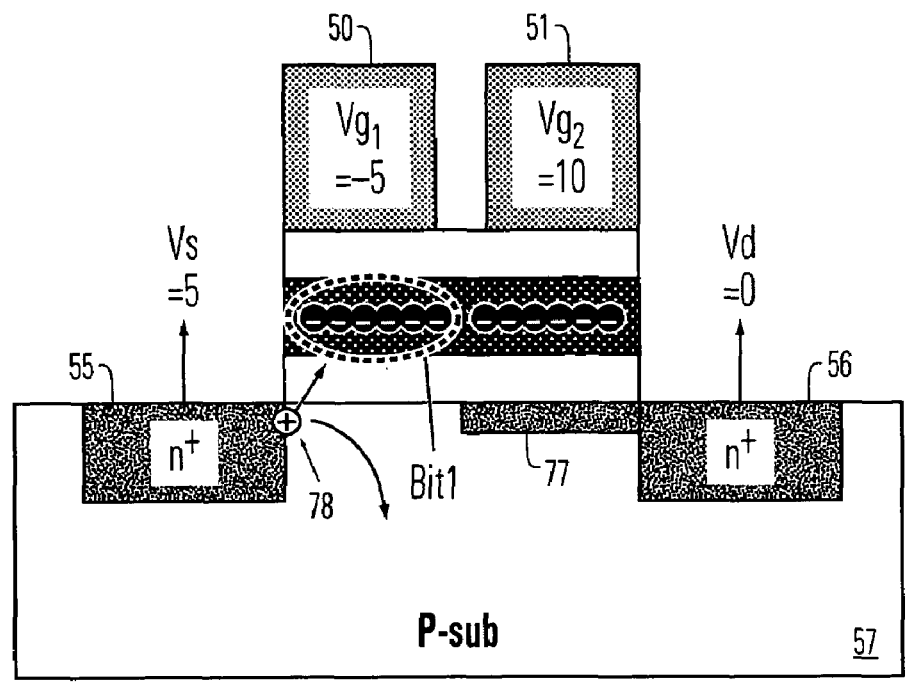
FIG. 9 illustrates a multiple-gate memory cell, having two control gates in series, with an alternative bias arrangement for erasing a storage location beneath a selected cell in the series.

FIGS. 8 and 9 illustrate alternative biasing arrangements for erasing data in a memory cell like that of FIG. 4, operated with one bit per control gate in the multiple-gate cell, and which is suitable for use in combination with the programming bias arrangement of FIG. 6. As illustrated in FIG. 8, an erasing bias arrangement for erasing "bit 1" in a storage location beneath the control gate 50 includes applying a gate voltage $Vg_1$ of about −5 Volts to gate 50, a gate voltage $Vg_2$ of about 10 volts to gate 51, while grounding the terminal 55 and applying about 5 volts to the terminal 56. This creates inversion region 75 beneath the gate 51, and induces hot holes 76 in the substrate beneath the gate 50. The hot holes are injected into the storage location of "bit 1," displacing electrons and reducing the threshold voltage for the storage location beneath the gate 50.

As illustrated in FIG. 9, an alternative erasing bias arrangement for erasing "bit 1" in a storage location beneath the control gate 50 includes applying a gate voltage $Vg_1$ of about −5 Volts to gate 50, a gate voltage $Vg_2$ of about 10 volts to gate 51, while grounding the terminal 56 and applying about 5 volts to the terminal 55. This creates inversion region 77 beneath the gate 51, and induces hot holes 78 in the substrate beneath the gate 50. The hot holes are injected into the storage location of "bit 1," displacing electrons and reducing the threshold voltage for the storage location beneath the gate 50. In some embodiments, "bit 1" can be erased by applying first the biasing arrangement of FIG. 8, followed by the biasing arrangement of FIG. 9, which may tend to balance the charge distribution in the storage location.

Figure 10:
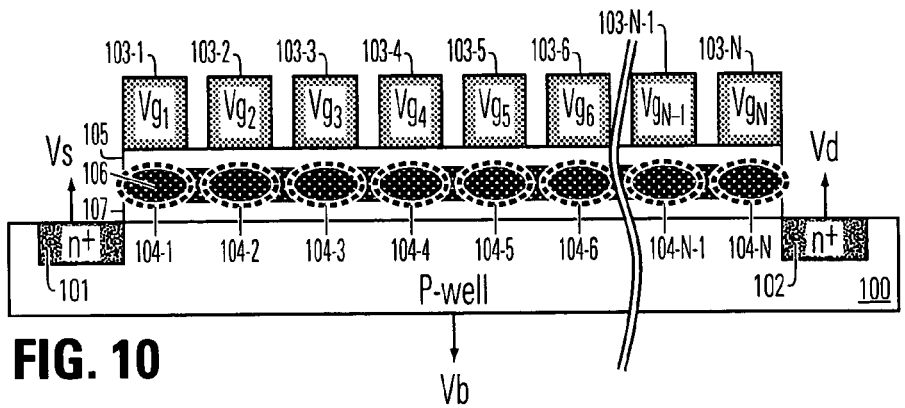
FIG. 10 illustrates a multiple-gate memory cell, having N control gates.

FIG. 10 illustrates an embodiment in which there are more than two gates in a multiple-gate memory cell, extending the embodiment illustrated in FIG. 4 to a number N of gates over a single continuous channel region in a substrate 100. The multiple-gate cell in FIG. 10 includes a first terminal 101 and a second terminal 102 implemented by buried diffusion in the substrate 100. A plurality of control gates, 103-1 through 103-N overlie a charge storage structure comprising top dielectric 105, charge trapping layer 106, and bottom dielectric 107. Charge storage locations 104-1 through 104-N within the charge trapping layer 106 overlie the substrate in the continuous channel region between the terminals 101 and 102. As illustrated in the figure, a bias arrangement applies gate voltages $Vg_1$ through $Vg_N$ to the control gates 103-1 through 103-N, a source voltage Vs to terminal 101 and a drain voltage Vd to terminal 102. Of course, the source and drain voltages could be applied in opposite manner to terminals 102 and 101, respectively.

The number N of control gates in a single, multiple-gate memory cell as illustrated in FIG. 10 can be selected as suits the needs of a particular implementation. For example, in one embodiment N is equal to 8. In other embodiments, N can be greater or smaller than 8.

Figure 11:
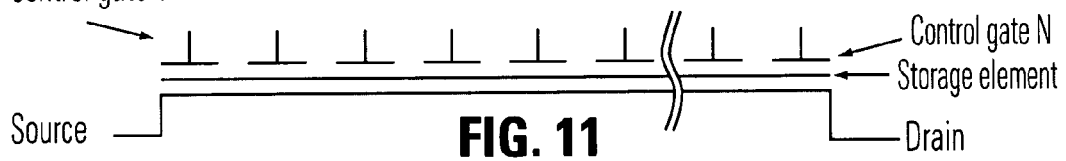
FIG. 11 is a schematic symbol for a multiple-gate memory cell like that of FIG. 4.

FIG. 11 shows a schematic symbol of a multiple-gate structure, like that described with reference to FIG. 10, where the source and drain correspond with terminals 101 and 102, respectively, and control gate 1 corresponds with gate 103-1, and control gate N corresponds with gate 103-N.

Figure 12:
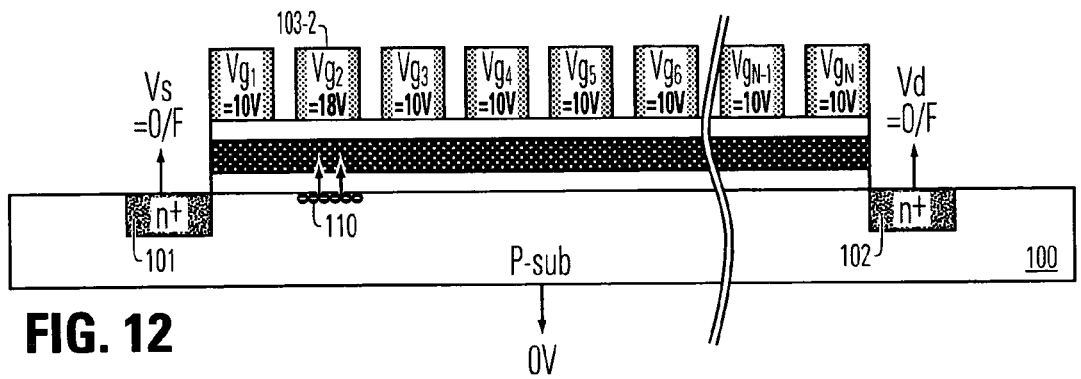
FIG. 12 illustrates a multiple-gate memory cell, having N control gates in series, with a bias arrangement for programming a storage location beneath a selected cell in the series.

FIG. 12 illustrates a bias arrangement for programming a selected memory location in a multiple-gate memory cell, like that described with reference to FIG. 10. According to the bias arrangement, FN tunneling is induced in the location represented by the electron symbols 110 in the charge storage structure beneath gate 103-2, by grounding the substrate 100, applying $Vg_2$ of 18 volts to gate 103-2, applying about 10 volts to gates 103-1 and 103-3 through 103-N, while one of the terminals 101 and 102 is grounded and the other is either grounded or left floating.

Figure 13:
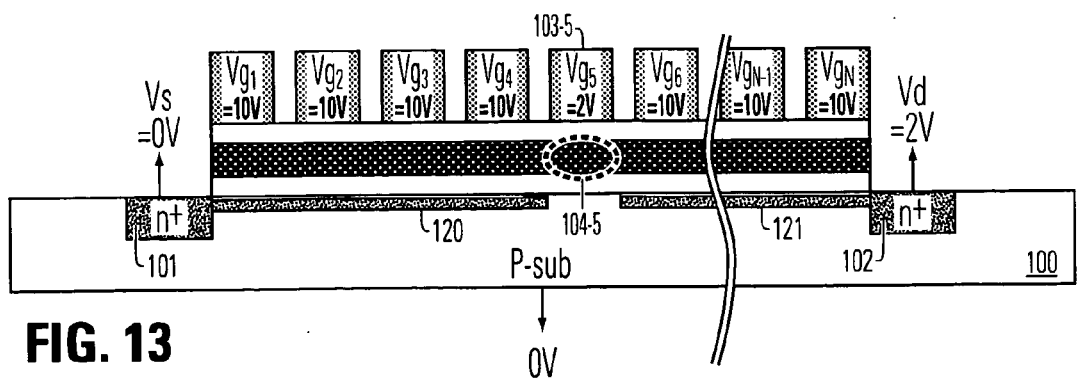
FIG. 13 shows a multiple-gate memory cell, having N control gates in series, with a bias arrangement for reading a storage location beneath a selected cell in the series.

FIG. 13 illustrates one example bias arrangement for reading "bit 5" in the storage location 104-5 with terminal 102 acting as a drain with positive 2 Volts applied, and terminal 101 acting as a source with ground applied. The gate voltages $Vg_1$ through $Vg_4$ and $Vg_6$ through $Vg_N$, are high enough to cause inversions 120 and 121 in the channel region between the terminals 101 and 102. The inversions 120 and 121, induced by the gate voltages $Vg_1$ through $Vg_4$ and $Vg_6$ through $Vg_N$, serve to couple the voltage at the drain or the source to the region in the channel near the storage location 104-5. The gate voltage $Vg_5$ applied to gate 103-5 is set above the low threshold state for the memory cell, and below the high threshold state. In the illustrated example, a gate voltage $Vg_5$ of about 2 Volts is applied.

Figure 14:
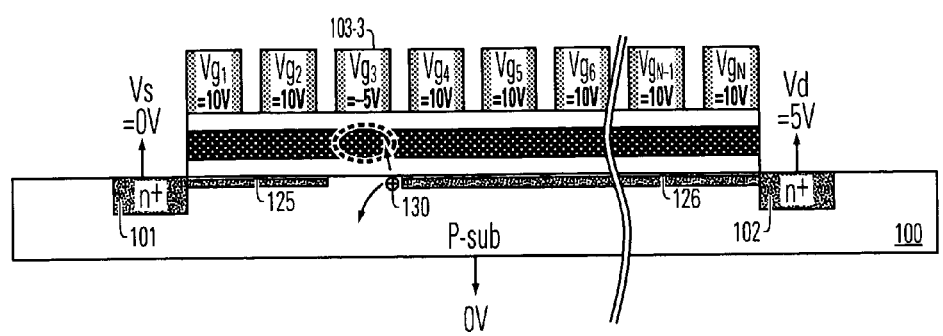
FIG. 14 shows a multiple-gate memory cell, having N control gates in series, with a bias arrangement for erasing a storage location beneath a selected cell in the series.
Figure 15:
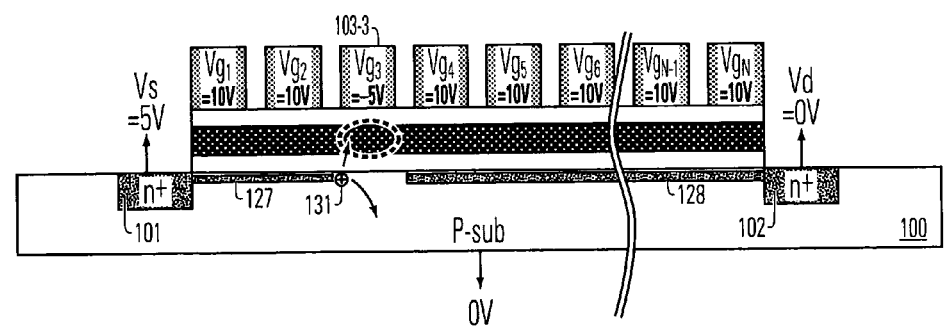
FIG. 15 shows a multiple-gate memory cell, having N control gates m series, with an alternative bias arrangement for erasing a storage location beneath a selected cell in the series.

FIGS. 14 and 15 illustrate alternative biasing arrangements for erasing data in a memory cell like that of FIG. 10, operated with one bit per control gate in the multiple-gate cell, and which is suitable for use in combination with the programming bias arrangement of FIG. 12. As illustrated in FIG. 14, an erasing bias arrangement for erasing "bit 3" in a storage location beneath the control gate 103-3 includes applying a gate voltage $Vg_3$ of about −5 Volts to gate 103-3, gate voltages $Vg_1$–$Vg_2$ and $Vg_4$–$Vg_N$ of about 10 volts to gate 103-3, while grounding the terminal 101 and applying about 5 volts to the terminal 102. This creates inversion region 125 beneath the gates 103-1 and 103-2 and inversion region 126 beneath the gates 103-4 through 103-N, and induces hot holes 130 in the substrate beneath the gate 103-3. The hot holes are injected into the storage location of "bit 3," displacing electrons and reducing the threshold voltage for the storage location beneath the gate 103-3.

As illustrated in FIG. 15, an alternative erasing bias arrangement for erasing "bit 3" in a storage location beneath the control gate 103-3 includes applying a gate voltage $Vg_3$ of about −5 Volts to gate 103-3, gate voltages $Vg_1$–$Vg_2$ and $Vg_4$–$Vg_N$ of about 10 volts to gate 103-3, while grounding the terminal 102 and applying about 5 volts to the terminal 101. This creates inversion region 127 beneath the gates 103-1 and 103-2 and inversion region 128 beneath the gates 103-4 through 103-N, and induces hot holes 131 in the substrate beneath the gate 103-3. The hot holes are injected into the storage location of "bit 3," displacing electrons and reducing the threshold voltage for the storage location beneath the gate 103-3.

In some embodiments, "bit 3," or other selected bits can be erased by applying first the biasing arrangement of FIG. 14, followed by the biasing arrangement of FIG. 15, which may tend to balance the charge distribution in the storage location.

Figure 16:
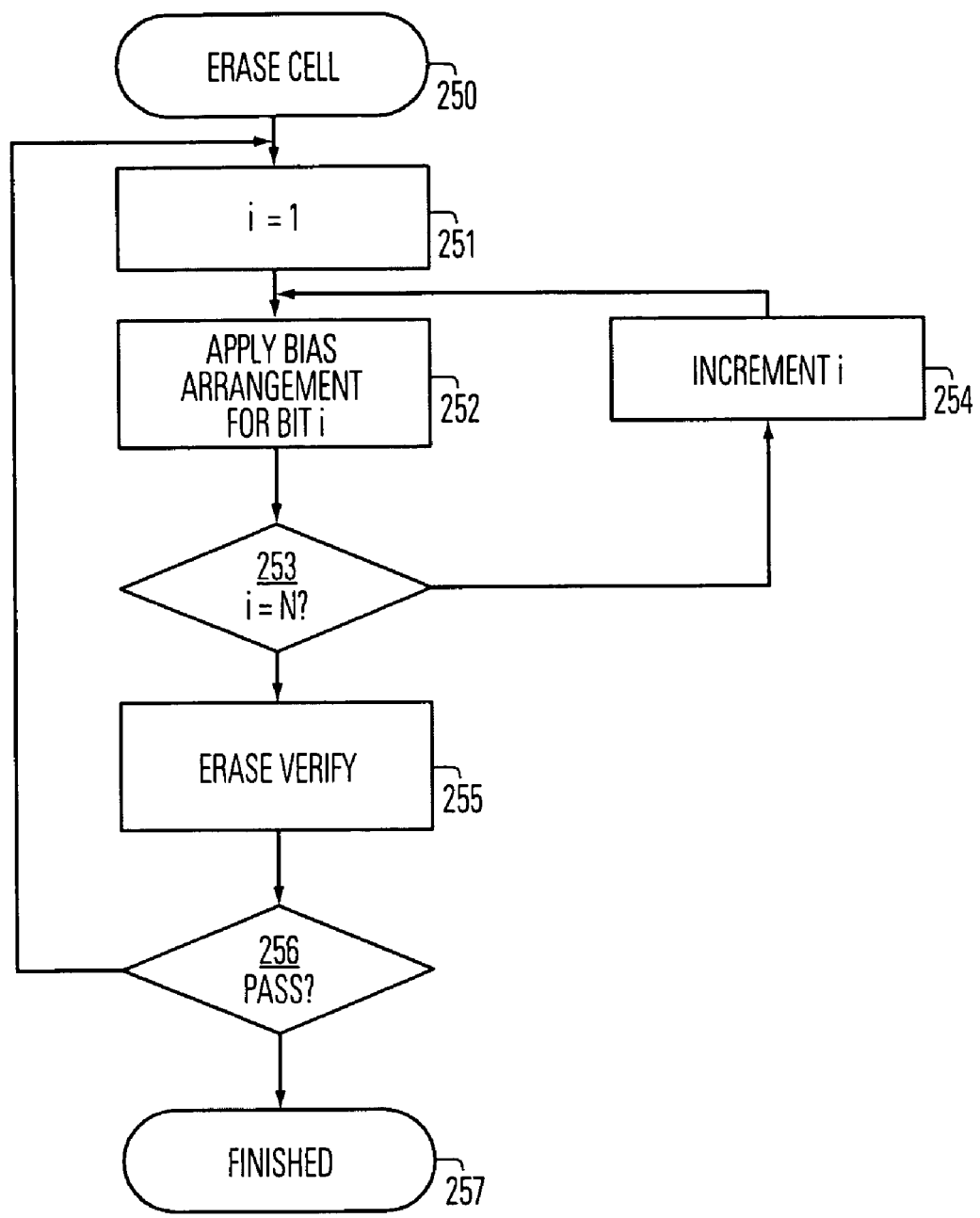
FIG. 16 is a simplified flow chart of an erasing procedure, applying the bias arrangement of FIG. 14 or FIG. 15.

FIG. 16 illustrates an erase procedure suitable for use with the biasing arrangement of FIGS. 14 and 15, where the procedure is required to bias each bit location separately to induce hot holes in the vicinity of the bit locations. The procedure begins with the command (block 250) to erase all of the data in a memory cell, such as the memory cell illustrated in FIG. 10. A step in the procedure includes setting an index i=1 (block 251), where the index i corresponds with the gate number 1 through N within the memory cell. A bias arrangement is applied for the current bit (block 252). The bias arrangement applied can be the arrangement of FIG. 14, the arrangement of FIG. 15, or other bias arrangements. Next, the procedure determines if all bit locations in the cell have been erased, by testing whether the index i=N (block 253). If the index i is not N, then the process proceeds to block 254, increments the index i, and applies the bias arrangement to the next bit location in the cell at block 251. If the index i is N, then an erase verify procedure is executed in this example (block 255). Next, the process tests whether the erase verify procedure passed the memory cell (block 256). If it did not pass, then the procedure starts over in this embodiment at block 251. If the cell did pass erase verify, then the procedure is finished (block 257). Other embodiments include procedures for erasing a plurality of cells in parallel, such as a set of cells sharing the same set of bit lines. Embodiments of the procedure can apply erase verify and retry processes for each bit location, by verifying after block 252 before incrementing the index i, and retrying block 252, if the verify fails.

Figure 17:
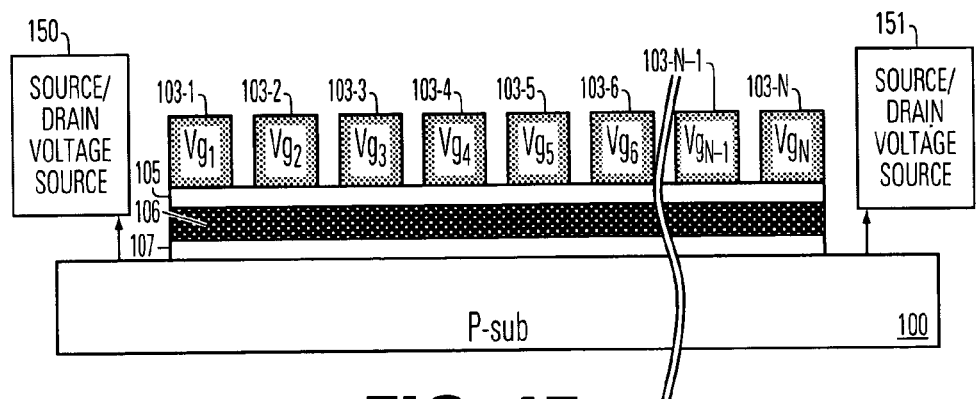
FIG. 17 shows a multiple-gate memory cell, having N control gates in series, with circuitry for conducting source and drain voltages to the semiconductor body near first and last gates in the series.

FIG. 17 illustrates an embodiment of a multiple-gate memory cell, like that of FIG. 10, with circuitry, represented by boxes 150, 151, to conduct source and drain bias voltages to terminal locations in the semiconductor body near the first gate 103-1 and the last gate 103-N in the series of gates of the cell. The circuitry 150, 151 can be implemented in many ways. Examples include use of a doped region terminal, like terminals 101, 102 of FIG. 10, to which contact is made to conductors supplying voltage to the terminals 101, 102. The terminals 101, 102 can be implemented as local contact points to which interconnected structures not shown in figure are laid out in metal layers or other layers of the integrated circuit to establish contact with the terminals. Alternatively, the terminals 101, 102 can be implemented as conductive lines shared by a column of multiple-gate memory cells, and coupled to circuitry for supplying the voltages anywhere along the column.

Figure 18:
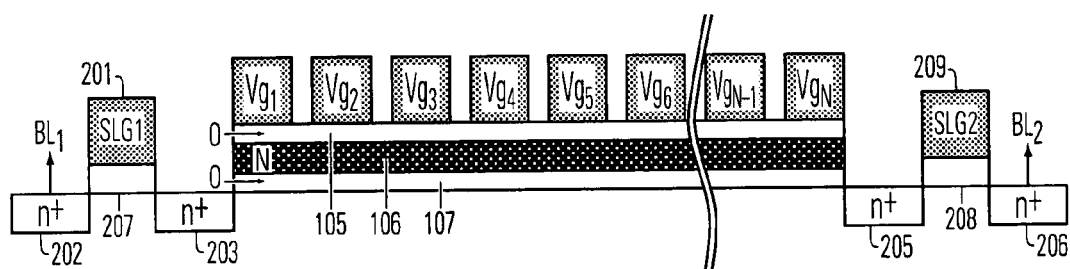
FIG. 18 shows a multiple-gate memory cell, having N control gates in series, with select gate transistors for conducting source and drain voltages to the semiconductor body near first and last gates in the series.

FIG. 18 illustrates another embodiment of the circuitry to conduct source and drain bias voltages to the semiconductor body. In this embodiment, a first select gate transistor comprising gate 201, a doped region at terminal location 202 and a doped region at terminal location 203, and a second select gate transistor comprising gate 209, a doped region at terminal location 205 and a doped region at terminal location 206 are included. The doped regions at terminal locations 202 and 206 are coupled to global bit lines or other bit line structures which deliver bias voltages to the respective terminals. The bias voltages are coupled to the doped regions at terminal locations 203 and 205 in response to control voltages SLG1 and SLG2 applied to the gates 201, 202. A gate dielectric 207, such as a single layer of silicon dioxide, overlies the channel region between the terminals 202 and 203. Likewise, gate dielectric 208 overlies the channel region between the terminals 205 and 206.

Figure 19:
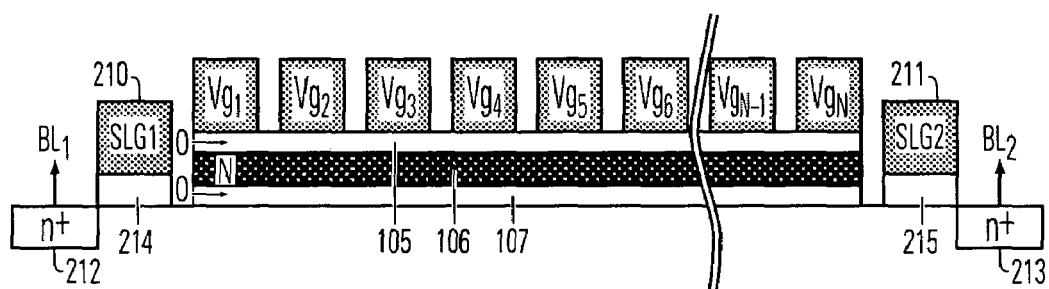
FIG. 19 shows a multiple-gate memory cell, having N control gates in series, with an alternative implementation for select gates for conducting source and drain voltages to the semiconductor body near first and last gates in the series.

FIG. 19 illustrates another embodiment of the circuitry to conduct source and drain bias voltages to the semiconductor body. In this embodiment, a first select gate 210 and a second select gate 211 are implemented over the semiconductor body and gate dielectrics 214, 215 respectively. The first and second select gates 210, 211 are placed between the terminal locations 212 and 213, respectively, on opposite ends of the series of gates, and the continuous channel region beneath the charge storage locations in the multiple-gate memory cell. FIG. 19 differs from the embodiment of FIG. 18 by eliminating the doped regions at terminal locations 203 and 205. Bias voltages are applied via the at terminal locations 212 and 213 by inducing inversion regions beneath the first select gate 210 and a second select gate 211, which conduct voltages from the terminals 212 and 213 to the continuous channel region beneath the charge storage locations in the multiple-gate memory cell.

Figure 20:
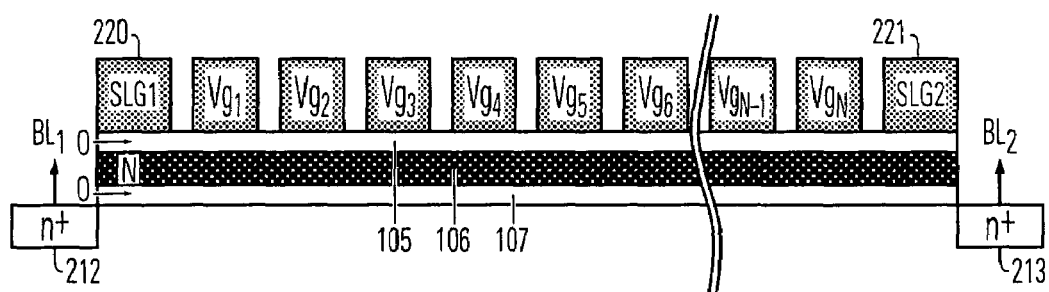
FIG. 20 shows a multiple-gate memory cell, having N control gates in series, with another alternative implementation for select gates for conducting source and drain voltages to the semiconductor body near first and last gates in the series.

FIG. 20 illustrates yet another embodiment of circuitry to conduct source and drain bias voltages to the semiconductor body. The embodiment of FIG. 20 differs from that of FIG. 19 because the charge storage structure, including top dielectric 105, charge trapping layer 106, and bottom dielectric layer 107 is extended beneath the first select gate 220 and the second select gate 221.

Figure 21:
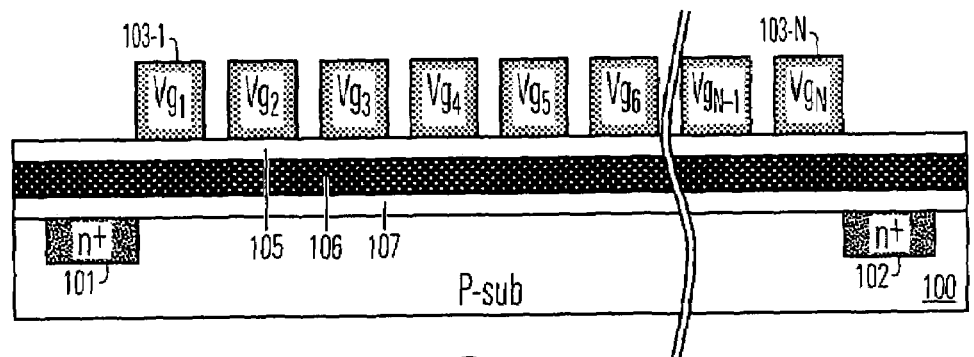
FIG. 21 shows a multiple-gate memory cell, having N control gates in series, with alternative implementation circuitry for conducting source and drain voltages to the semiconductor body near first and last gates in the series.

FIG. 21 illustrates yet another embodiment of circuitry to conduct source and drain bias voltages to the terminal locations in the semiconductor body. The embodiment of FIG. 21 differs from that of FIG. 10, because the charge storage structure, including top dielectric 105, charge trapping layer 106, and bottom dielectric layer 107 is extended over the doped region terminals 101 and 102.

Figure 22:
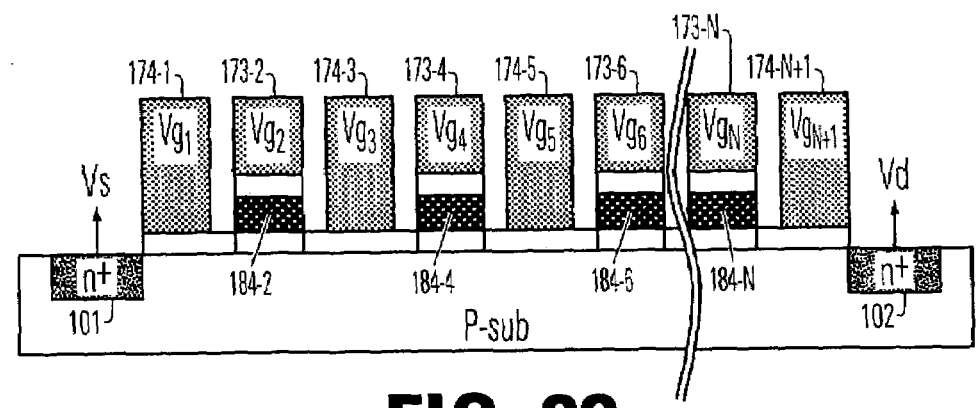
FIG. 22 shows a multiple-gate memory cell, having an odd number N+1 of control gates in series, with even numbered gates in the series acting as control gates for storage of data.
Figure 23:
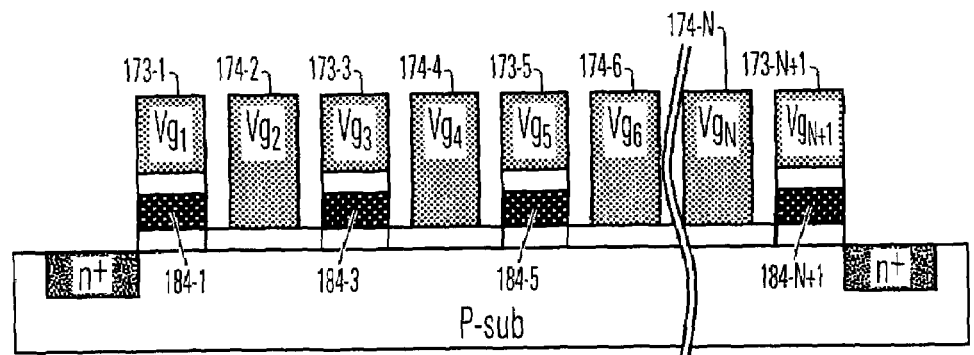
FIG. 23 shows a multiple-gate memory cell, having an odd number N+1 of control gates in series, with odd numbered gates in the series acting as control gates for storage of data.

FIGS. 22 and 23 illustrate embodiments of the multiple-gate memory cell in which only every other gate overlies a storage location and acts as a control gate for reading and writing data. In the illustrated embodiments, select gates are implemented between each of the control gates. In embodiments like those shown in FIGS. 22 and 23, it may be preferable to include an odd number of gates in the series of gates for the multiple-gate cell. Hence, the last gate in the series can be considered gate number "N+1." In the embodiment of FIG. 22, even-numbered gates act as control gates for storage of data. The charge storage structure can be continuous between all the gates, or segmented as shown in the figures so that it underlies only the control gates for storage of data. Thus, gates 173-2, 173-4, 173-6, . . . 173-N overlie charge storage locations 184-2, 184-4, 184-6, 184-N, while gates 174-1, 174-3, 174-5, . . . 174-N+1 are used as select gates to induce inversion regions for controlling the programming and reading of the multiple-gate memory cell.

In the embodiment of FIG. 23, odd-numbered gates act as control gates for storage of data. The charge storage structure can be continuous between all the gates, or segmented as shown in the figures so that it underlies only the control gates for storage of data. Thus, gates 173-1, 173-3, 173-5, . . . 173-N+1 overlie charge storage locations 184-1, 184-3, 184-5, 184-N+1, while gates 174-2, 174-4, 174-6, . . . 174-N are used as select gates to induce inversion regions for controlling the programming and reading of the multiple-gate memory cell.

Figure 24A:
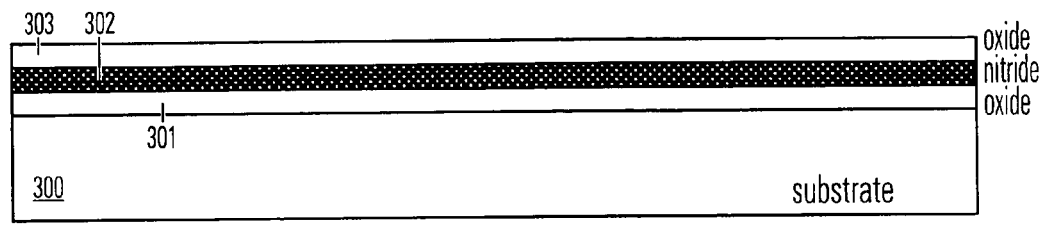
FIGS. 24A–24F illustrate a process for manufacturing a multiple-gate memory cell.

FIGS. 24A–24F illustrate one method for manufacturing a multiple-gate memory cell like that of FIG. 10. The process begins as shown in FIG. 24A, with providing a semiconductor substrate 300, such as a p-type silicon substrate or other semiconductor substrate. In embodiments of the invention, the substrate 300 is isolated using so-called triple-well techniques, where the semiconductor substrate 300 comprises a p-type region embedded within an n-type region, which is in turn embedded in a p-type region. In the area of the substrate on which multiple-gate memory cells are to be implemented, a bottom oxide layer 301, charge trapping layer 302, and top oxide layer 303 are formed. These layers can be formed using a variety of techniques known in the art, including thermal oxide growth, chemical vapor deposition, plasma enhanced chemical vapor deposition, high-density plasma chemical vapor deposition, atomic layer deposition and other known and emerging technologies.

Figure 24B:
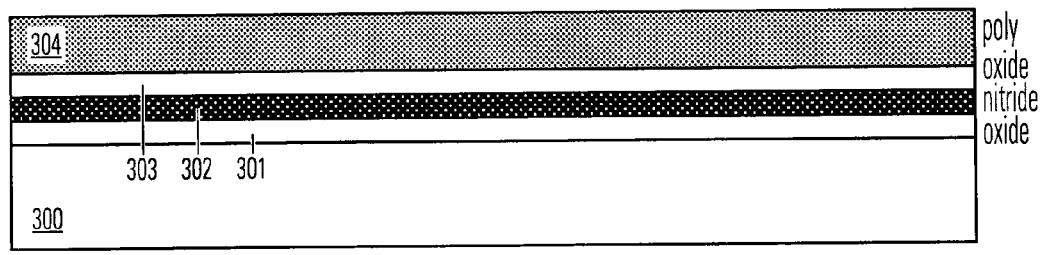

As illustrated in FIG. 24B, after formation of the bottom oxide layer 301, charge trapping layer 302, and top oxide layer 303, a layer 304 of polysilicon, or other conductive gate material is deposited over the area on the substrate in which multiple-gate memory cells are to be implemented. The polysilicon can be deposited using a variety of known technologies.

Figure 24C:
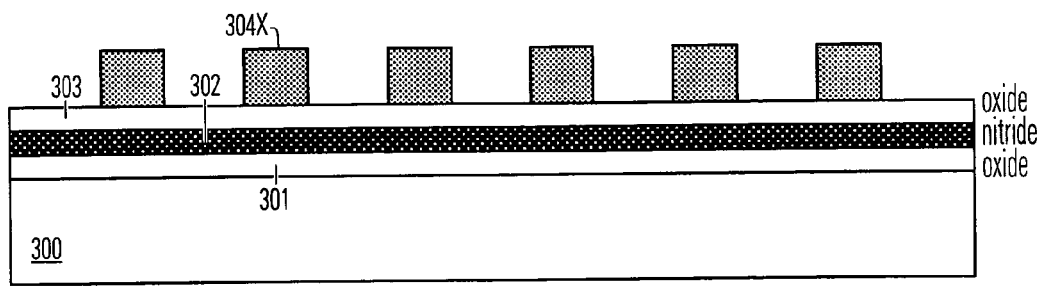

As illustrated in FIG. 24C, the polysilicon layer 304 is etched in a pattern to form gate electrodes 304x. In some embodiments, the gate electrodes are implemented by word line structures, which would extend in parallel lines across the area in which the cells are to be implemented, into the page of the drawing.

Figure 24D:
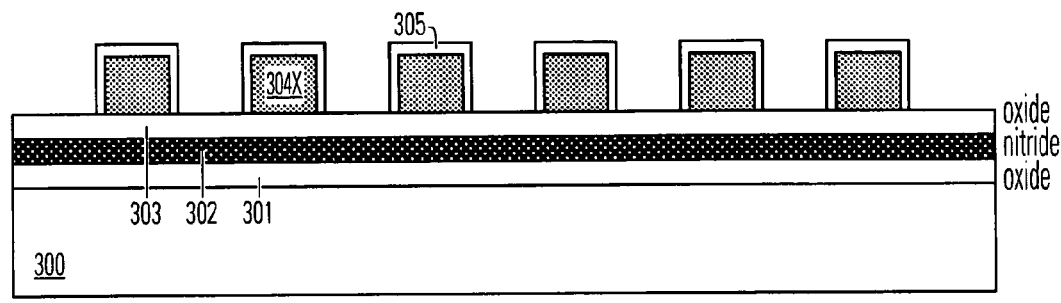

As illustrated in FIG. 24D, the plurality of gate electrodes 304x are covered, including the sidewalls, in a next step with an isolation layer 305 of dielectric material, such as silicon dioxide, silicon nitride, or other insulating material. The layer 305 of dielectric material covers the sidewalls of the gate electrodes 304x, to isolate it from adjacent gates which fills the gaps. The thickness of the isolation layer 305 on the sidewalls of the gate electrodes is less than 100 nm in one embodiment. In embodiments having a minimum feature size F, the thickness is preferably less than 0.1 F. Generally, the thickness of the isolation layer as small as possible in the context, and substantially less than the lengths of the gate electrodes 304x.

Figure 24E:
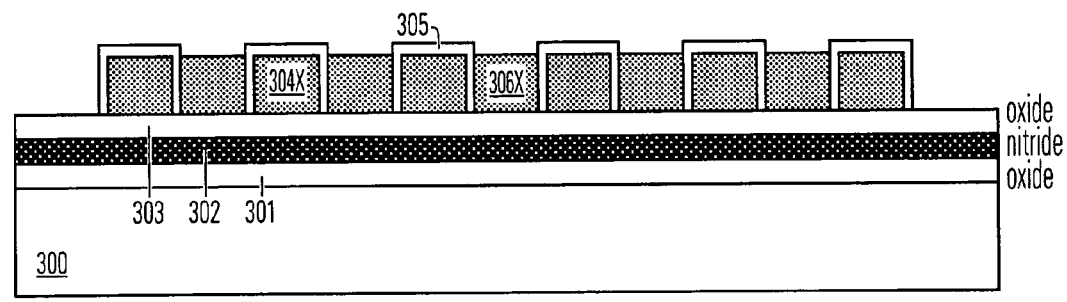

As illustrated in FIG. 24E, a second polysilicon deposition is performed to form gate electrodes 306x between the gate electrodes 304x. The second polysilicon deposition can be implemented using chemical vapor deposition or other techniques, which effectively fill the gaps. As illustrated, the gate electrodes 306x have the same height as the gate electrodes 304x. In other embodiments, the electrodes may not be the same height. In some embodiments, a chemical mechanical polishing technique for other planarizing technique can be used.

The gate electrodes 304x and 306x may include top layers of silicide or metal to improve conductivity as known in the art.

Figure 24F:
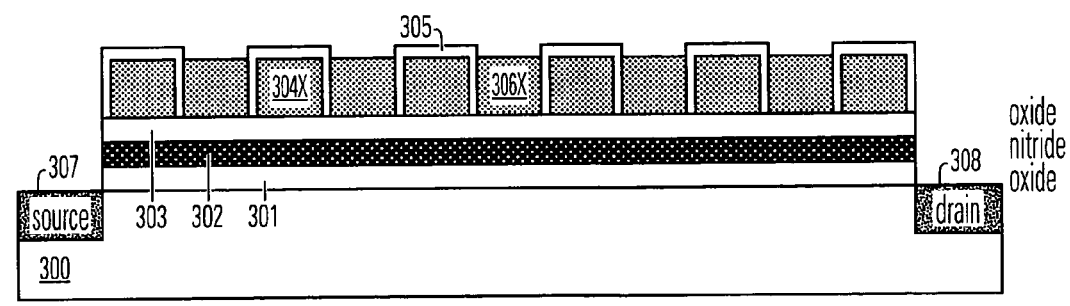

Finally, as illustrated in FIG. 24F, the charge storage structure including the bottom oxide layer 301, charge trapping layer 302, top oxide layer 303 and polysilicon layers are patterned and etched to expose implant regions in the substrate 300, and n-type impurities are implanted in the terminal locations, to form source terminals 307 and drain terminals 308. As a result of the process steps of FIG. 24A–24F, a multiple-gate memory cell like that shown in FIG. 10 is implemented. Essentially the same sequence of steps can be applied to implement an array of such memory cells. Likewise, variations on the structure can be readily implemented using techniques known in the art.

Figure 25:
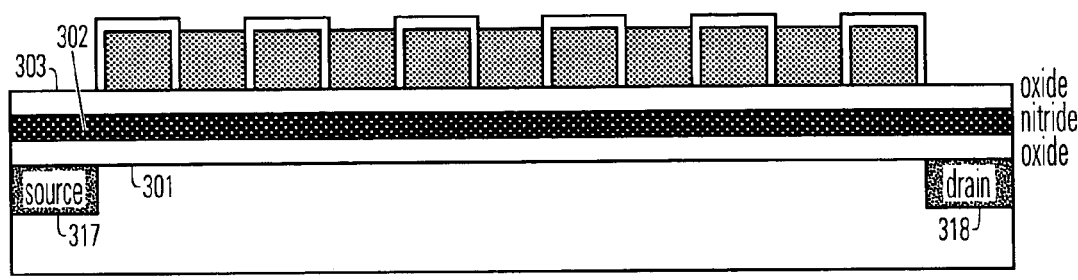
FIG. 25 illustrates a step in a process for manufacturing a multiple-gate memory cell, like the process of FIGS. 24A–24F, where the source and drain implants are made through the charge storage structure.

FIG. 25 illustrates a step of an embodiment of a process in which the bottom oxide layer 301, charge trapping layer 302, and top oxide layer 303 are not removed in the regions of the implants for the source terminal 317 and drain terminal 318 on the memory cell. Thus the implant procedure is modified as an alternative to the step of FIG. 24F, so that the implants are made through the layers of material used to implement the charge trapping structure.

Figure 26A:
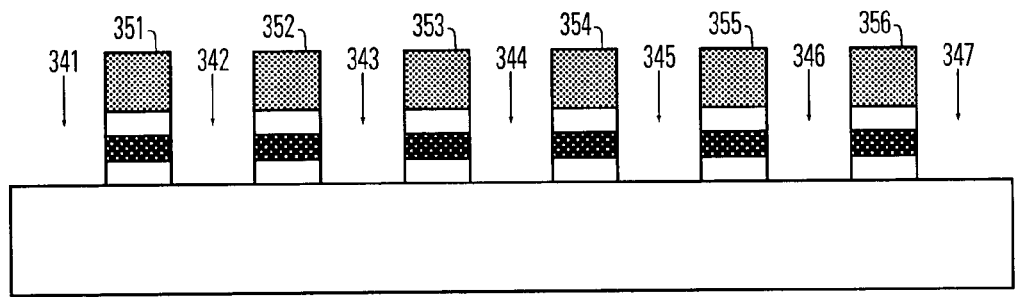
FIGS. 26A–26D illustrate steps of a process for manufacturing a multiple gate memory cell, like the multiple-gate memory cell of FIG. 22 or FIG. 23.
Figure 26B:
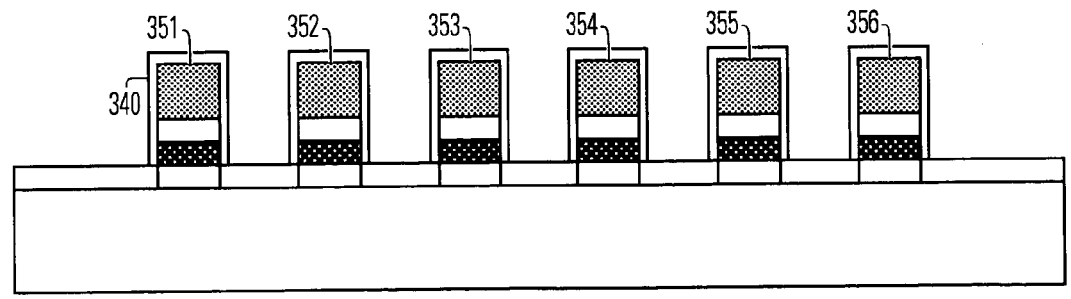
Figure 26C:
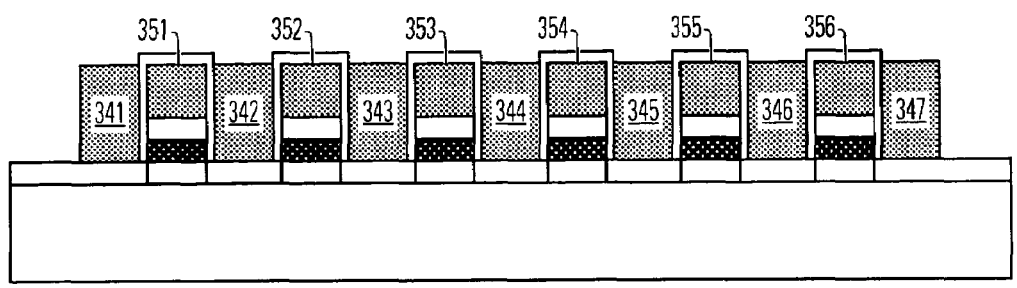
Figure 26D:
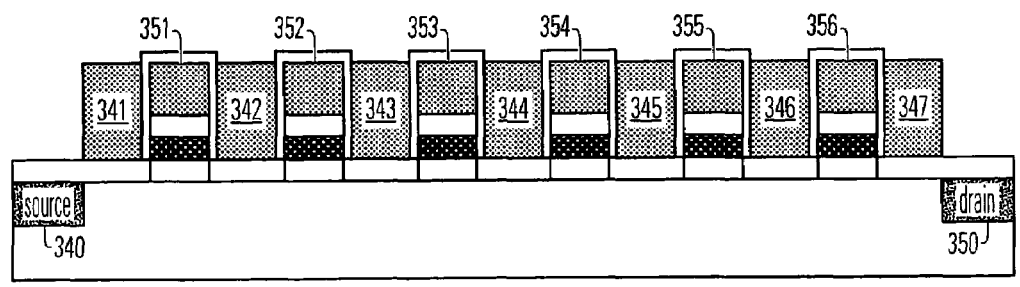

FIGS. 26A–26D illustrate one method for manufacturing a multiple-gate memory cell like that of FIG. 22. The process as before begins as shown in FIG. 24A–24B, with providing a semiconductor substrate 300. In the area of the substrate on which multiple-gate memory cells are to be implemented, a bottom oxide layer 301, charge trapping layer 302, and top oxide layer 303 are formed. FIG. 26A shows a next step in a process to implement the memory cell with storage locations under even numbered gates in the memory cell, as shown in FIG. 22. In the process of FIG. 26A–26D, the structure of FIG. 24B is patterned and etched without stopping at the top oxide 303 as done in FIG. 24C. Rather, the etch proceeds through the layers of material (301, 302, 303) used to make the charge storage locations to the substrate 300, leaving multilayer stacks 351–356, including charge storage locations beneath the polysilicon control gates. In the step illustrated in FIG. 26B, a layer of insulator 340 such as silicon dioxide is formed isolating the multilayer stacks 351–356 and providing a gate dielectric in the spaces 341–347. The step illustrated in FIG. 26C includes filling the spaces 341–347 with polysilicon. In the step illustrated in FIG. 26D, source and drain implants 349, 350 are made at terminal locations to complete the memory cell.

Figure 27:
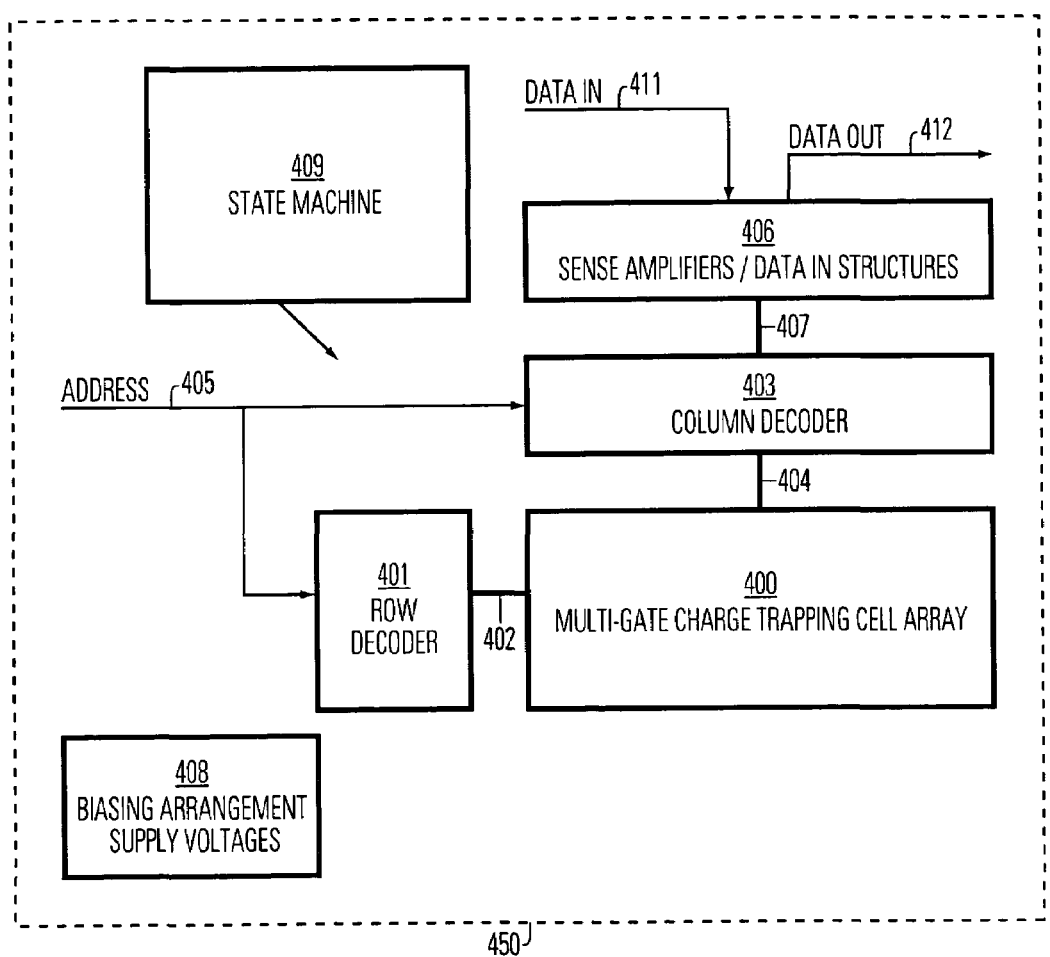
FIG. 27 is a block diagram of an integrated circuit including an array of multiple-gate memory cells.

FIG. 27 is a simplified block diagram of an integrated circuit according to an embodiment of the present invention. The integrated circuit 450 includes a memory array 400 implemented using multiple-gate, localized charge trapping memory cells, on a semiconductor substrate. A row decoder 401 is coupled to a plurality of word lines 402 and to select gate lines for the multiple-gate memory cells, and arranged along rows in the memory array 400. A column decoder 403 is coupled to a plurality of bit lines 404 arranged along columns in the memory array 400 for delivering source and drain voltages and for reading data from the multiple-gate memory cells in the array 400. Addresses are supplied on bus 405 to column decoder 403 and row decoder 401. Sense amplifiers and data-in structures in block 406 are coupled to the column decoder 403 via data bus 407. Data is supplied via the data-in line 411 from input/output ports on the integrated circuit 450, or from other data sources internal or external to the integrated circuit 450, to the data-in structures in block 406. Data is supplied via the data-out line 412 from the sense amplifiers in block 406 to input/output ports on the integrated circuit 450, or to other data destinations internal or external to the integrated circuit 450.

A controller implemented in this example using bias arrangement state machine 409 controls the application of bias arrangement supply voltages 408, such as read, program, erase, erase verify and program verify voltages. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

Figure 28:
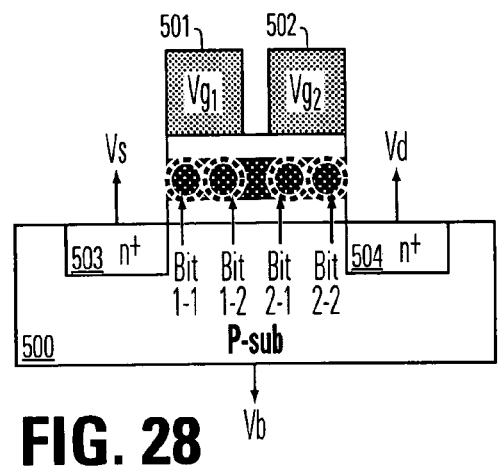
FIG. 28 illustrates a multiple-gate memory cell, having two control gates and two storage locations associated with each control gate.

FIG. 28 illustrates an embodiment in which there are two data storage locations beneath each control gate, for a cell having two control gates 501, 502. The cell illustrated comprises a semiconductor substrate 500, with an n-type terminal 503 and an n-type terminal 504 acting as source and drain for the memory cell. Charge storage locations for four bits are illustrated, where bit 1-1 and bit 1-2 are beneath the control gate 501, and bit 2-1 and bit 2-2 are beneath control gate 502. Bias voltages $Vg_1$ and $Vg_2$ are applied to the gate 501 and 502 respectively. In some embodiments, more than one bit can be stored in each of the two storage locations beneath each gate in the memory cell. A bias voltage Vs is applied to one of the terminals 503, 504, and a bias voltage Vd is applied to the other of the terminals 504, 503, depending on which terminal is performing the functions of a source and which is performing the function of a drain, for the memory cell. A bias voltage Vb is applied to the substrate 500. Bias arrangements are applied for programming, erasing and reading data in the charge storage locations.

Figure 29:
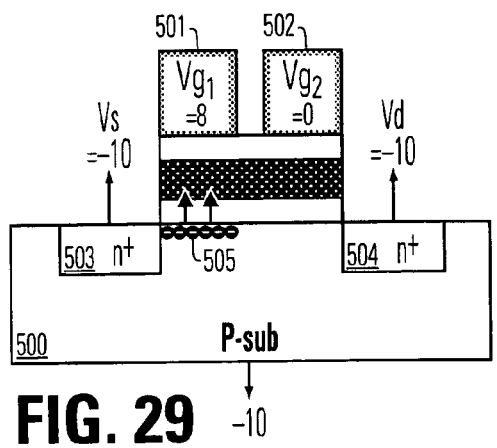
FIG. 29 illustrates a multiple-gate memory cell, having two control gates and two storage locations associated with each control gate, with a bias arrangement for erasing the data under a selected control gate.
Figure 30:
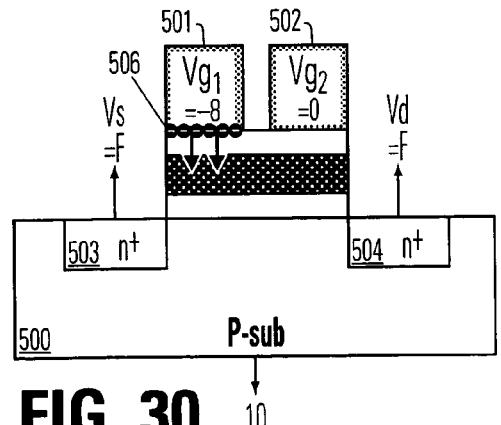
FIG. 30 illustrates a multiple-gate memory cell, having two control gates and two storage locations associated with each control gate, with an alternative bias arrangement for erasing the data under a selected control gate.

FIGS. 29 and 30 illustrate alternative bias arrangements for erasing the storage locations beneath particular gates. In the bias arrangement of FIG. 29, Fowler Nordheim FN tunneling (indicated by the symbol 505) is induced between the substrate 500 and the charge storage locations beneath the gate 501, by applying a positive gate voltage $Vg_1$ of about 8 volts in this example, to gate 501, applying about zero volts to gate 502, and applying about −10 volts to each of the source terminal 503, the drain terminal 504, and the substrate 500. The FN tunneling causes an increase in the threshold voltage of the cell, and establishes a high threshold erase state. In the bias arrangement of FIG. 30, FN tunneling (indicated by the symbol 506) is induced between the gate 501 and the charge storage locations beneath the gate 501, by applying a negative gate voltage $Vg_1$ of about −8 volts in this example, to gate 501, applying about zero volts to gate 502, and applying about positive 10 volts to the substrate 500, while floating each of the source terminal 503 and the drain terminal 504. The FN tunneling causes an increase in the threshold voltage of the cell, and establishes a high threshold erase state.

Figure 31:
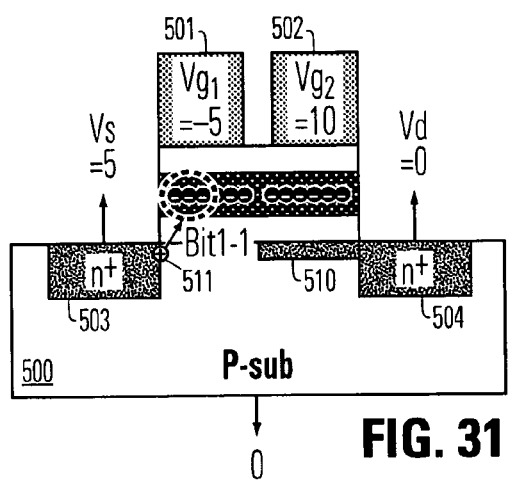
FIG. 31 illustrates a multiple-gate memory cell, having two control gates and two storage locations associated with each control gate, with a bias arrangement for programming the left side bit 1-1 beneath the first control gate.

Bias arrangements for programming two charge storage locations under each gate in the memory cells, which is suitable for use in combination with erase bias arrangements like those of FIGS. 29 and 30, is illustrated in FIGS. 31–34 based on hot hole injection. As shown in FIG. 31, bit 1-1 can be programmed by hot hole injection using a bias arrangement like that shown in the figure, in which gate 501 receives $Vg_1$=−5 volts, gate 502 receives $Vg_2$=+10 volts, terminal 503 receives Vs=+5 volts, terminal 504 receives Vd=0 volts and the substrate receives Vb=0 volts. The bias arrangement induces inversion 510 beneath the gate 502 due to the relatively high voltage on gate 502. Also, hot holes induced in the channel region adjacent the n+ implant region that acts as terminal 503 are injected as indicated by the symbol 511 into the charge storage structure, displacing electrons and reducing the threshold of the memory cell in the charge storage location for bit 1-1.

Figure 32:
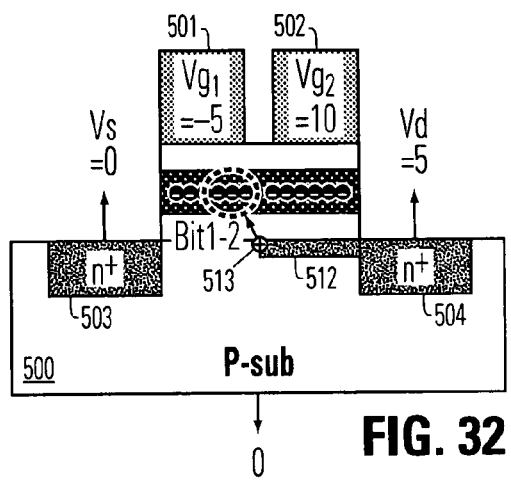
FIG. 32 illustrates a multiple-gate memory cell, having two control gates and two storage locations associated with each control gate, with a bias arrangement for programming the right side bit 1-2 beneath the first control gate.

As shown in FIG. 32, bit 1-2 can be programmed by hot hole injection using a bias arrangement like that shown in the figure, in which gate 501 receives $Vg_1$=−5 volts, gate 502 receives $Vg_2$=+10 volts, terminal 503 receives Vs=0 volts, terminal 504 receives Vd=+5 volts and the substrate receives Vb=0 volts. The bias arrangement induces inversion 512 beneath the gate 502 due to the relatively high voltage on gate 502. Also, hot holes induced in the channel region adjacent the inversion region 512 are injected as indicated by the symbol 513 into the charge storage structure, displacing electrons and reducing the threshold of the memory cell in the charge storage location for bit 1-2.

Figure 33:
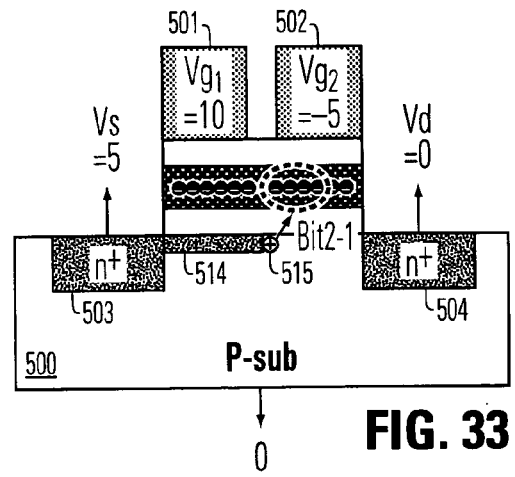
FIG. 33 illustrates a multiple-gate memory cell, having two control gates and two storage locations associated with each control gate, with a bias arrangement for programming the left side bit 2-1 beneath the second control gate.

As shown in FIG. 33, bit 2-1 can be programmed by hot hole injection using a bias arrangement like that shown in the figure, in which gate 501 receives $Vg_1$=+10 volts, gate 502 receives $Vg_2$=−5 volts, terminal 503 receives Vs=+5 volts, terminal 504 receives Vd=0 volts and the substrate receives Vb=0 volts. The bias arrangement induces inversion 514 beneath the gate 501 due to the relatively high voltage on gate 501. Also, hot holes induced in the channel region adjacent the inversion region 514 are injected as indicated by the symbol 515 into the charge storage structure, displacing electrons and reducing the threshold of the memory cell in the charge storage location for bit 2-1.

Figure 34:
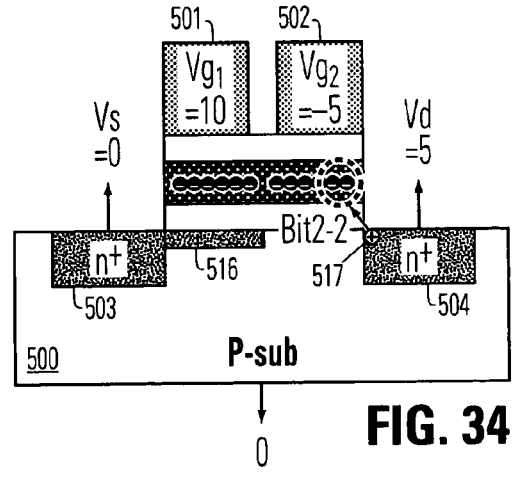
FIG. 34 illustrates a multiple-gate memory cell, having two control gates and two storage locations associated with each control gate, with a bias arrangement for programming the right side bit 2-2 beneath the second control gate.

As shown in FIG. 34, bit 2-2 can be programmed by hot hole injection using a bias arrangement like that shown in the figure, in which gate 501 receives $Vg_1$=+10 volts, gate 502 receives $Vg_2$=−5 volts, terminal 503 receives Vs=0 volts, terminal 504 receives Vd=+5 volts and the substrate receives Vb=0 volts. The bias arrangement induces inversion 516 beneath the gate 501 due to the relatively high voltage on gate 501. Also, hot holes induced in the channel region adjacent the n+ implant region that acts as terminal 504 are injected as indicated by the symbol 517 into the charge storage structure, displacing electrons and reducing the threshold of the memory cell in the charge storage location for bit 2-2.

Figure 35:
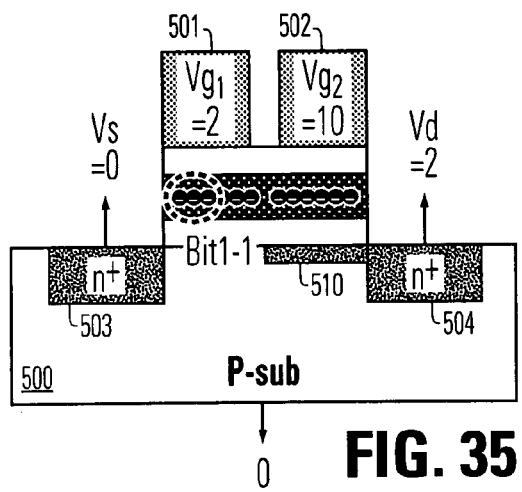
FIG. 35 illustrates a multiple-gate memory cell, having two control gates and two storage locations associated with each control gate, with a bias arrangement for reading the left side bit 1-1 beneath the first control gate.

Bias arrangements for reading two charge storage locations under each gate in the memory cells, which are suitable for use in combination with erase bias arrangements like those of FIGS. 29 and 30, and program bias arrangements like those of FIGS. 31–34, are shown in FIGS. 35–38. As shown in FIG. 35, bit 1-1 can be read using a reverse read bias arrangement like that shown in the figure, in which gate 501 receives $Vg_1$=2 volts, gate 502 receives $Vg_2$=+10 volts, terminal 503 receives Vs=0 volts, terminal 504 receives Vd=+2 volts and the substrate receives Vb=0 volts. The bias arrangement induces inversion 510 beneath the gate 502 due to the relatively high voltage on gate 502. The threshold of the memory cell for this reverse read bias arrangement is determined by the charge stored in the location of bit 1-1. If the charge storage location at the bit 1-1 is erased establishing a high threshold state, then no current flows under the read bias arrangement. Alternatively, if the charge storage location at bit 1-1 is programmed establishing a low threshold state, then current flows under the read bias arrangement through the channel of the memory cell.

Figure 36:
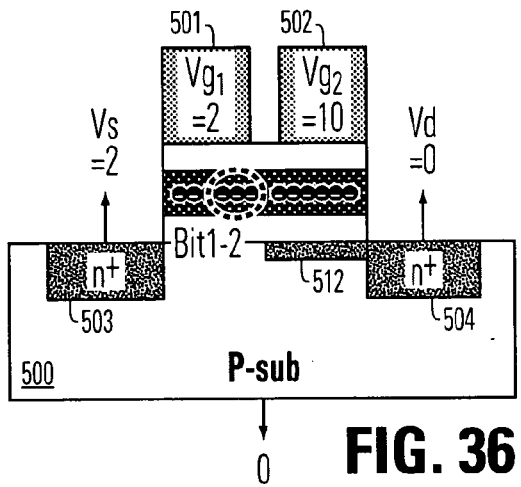
FIG. 36 illustrates a multiple-gate memory cell, having two control gates and two storage locations associated with each control gate, with a bias arrangement for reading the right side bit 1-2 beneath the first control ate.

As shown in FIG. 36, bit 1-2 can be read using a reverse read bias arrangement like that shown in the figure, in which gate 501 receives $Vg_1$=+2 volts, gate 502 receives $Vg_2$=+10 volts, terminal 503 receives Vs=+2 volts, terminal 504 receives Vd=0 volts and the substrate receives Vb=0 volts. The bias arrangement induces inversion 512 beneath the gate 502 due to the relatively high voltage on gate 502. If the charge storage location at the bit 1-2 is erased establishing a high threshold state, then no current flows under the read bias arrangement. Alternatively, if the charge storage location at bit 1-2 is programmed establishing a low threshold state, then current flows under the read bias arrangement through the channel of the memory cell.

Figure 37:
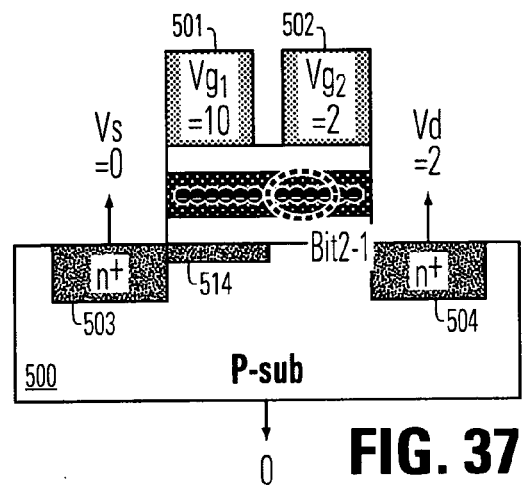
FIG. 37 illustrates a multiple-gate memory cell, having two control gates and two storage locations associated with each control gate, with a bias arrangement for reading the left side bit 2-1 beneath the second control gate.

As shown in FIG. 37, bit 2-1 can be read using a reverse read bias arrangement like that shown in the figure, in which gate 501 receives $Vg_1$=+10 volts, gate 502 receives $Vg_2$=+2 volts, terminal 503 receives Vs=0 volts, terminal 504 receives Vd=+2 volts and the substrate receives Vb=0 volts. The bias arrangement induces inversion 514 beneath the gate 501 due to the relatively high voltage on gate 501. If the charge storage location at the bit 2-1 is erased establishing a high threshold state, then no current flows under the read bias arrangement. Alternatively, if the charge storage location at bit 2-1 is programmed establishing a low threshold state, then current flows under the read bias arrangement through the channel of the memory cell.

Figure 38:
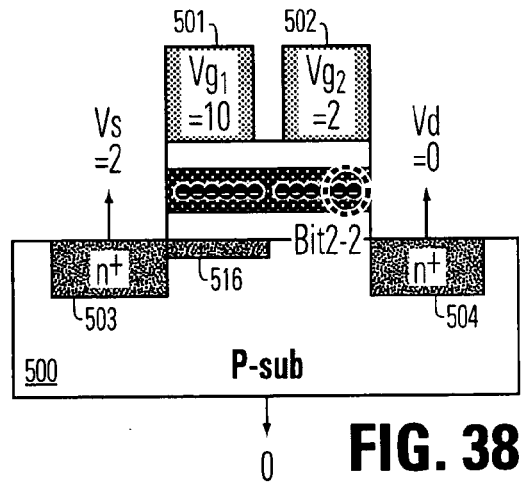
FIG. 38 illustrates a multiple-gate memory cell, having two control gates and two storage locations associated with each control gate, with a bias arrangement for reading the right side bit 2-2 beneath the second control gate.

As shown in FIG. 38, bit 2-2 can be read using a reverse read bias arrangement like that shown in the figure, in which gate 501 receives $vg_1$=+10 volts, gate 502 receives $Vg_2$=+2 volts, terminal 503 receives Vs=+2 volts, terminal 504 receives Vd=0 volts and the substrate receives Vb=0 volts. The bias arrangement induces inversion 516 beneath the gate 501 due to the relatively high voltage on gate 501. If the charge storage location at the bit 2-2 is erased establishing a high threshold state, then no current flows under the read bias arrangement. Alternatively, if the charge storage location at bit 2-2 is programmed establishing a low threshold state, then current flows under the read bias arrangement through the channel of the memory cell.

Figure 39:
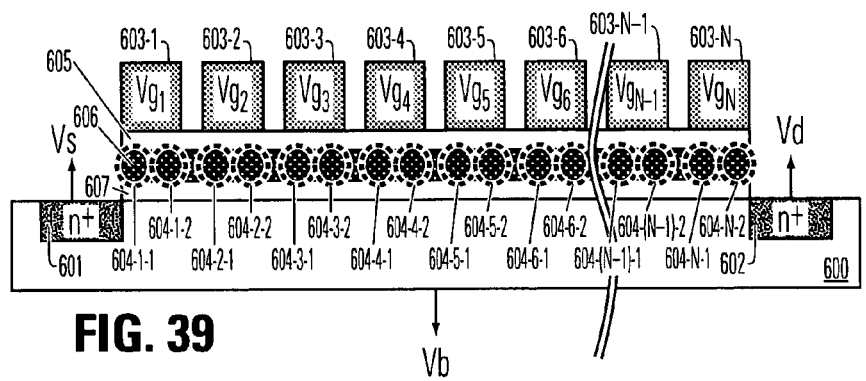
FIG. 39 illustrates a multiple-gate memory cell, having N control gates and two storage locations associated with each control gate.

The cell structure of FIG. 28 having two gates, and two storage locations associated with each gates, is extended to an embodiment as illustrated in FIG. 39, having N gates, where N is greater than 2. The multiple-gate memory cell in FIG. 39 is formed in a semiconductor body 600 having a p-type impurity. N-type terminals 601, 602 act as source and drain for the multiple-gate memory cell. The charge storage structure comprising a top dielectric 605, a charge trapping dielectric 606, and a bottom dielectric 607 overlie a continuous channel region between the terminals 601, 602. Control gates 603-1 through 603-N overlie the charge storage structure and the channel region. According to the illustrated embodiment, there are two charge storage locations associated with each of the control gates 603-1 through 603-N. Thus, as illustrated, charge storage locations 604-1-1 and 604-1-2 are associated with gates 603-1. Charge storage locations 604-2-1 and 604-2-2 are associated with gates 603-2. Charge storage locations 604-3-1 and 604-3-2 are associated with gates 603-3. Charge storage locations 604-4-1 and 604-4-2 are associated with gates 603-4. Charge storage locations 604-5-1 and 604-5-2 are associated with gates 603-5. Charge storage locations 604-6-1 and 604-6-2 are associated with gates 603-6. Charge storage locations 604-(N-1)-1 and 604-(N-1)-2 are associated with gates 603-N-1. Charge storage locations 604-N-1 and 604-N-2 are associated with gates 603-N. Circuitry associated with the memory cell applies bias voltages for programming, erasing and reading data stored in the charge storage locations. The bias voltages include $Vg_1$ through $Vg_N$ at the control gates 603-1 through 603-N, respectively. The bias voltages include Vs applied to terminals 601, and Vd applied to terminal 602. Finally, the bias voltages include Vb applied to the semiconductor body 600. The semiconductor body 600 comprises an isolated region in a larger semiconductor substrate in some embodiments as discussed above.

Representative bias arrangements for erasing, programming and reading the memory cell of FIG. 39 are explained with reference to FIGS. 40–45.

Figure 40:
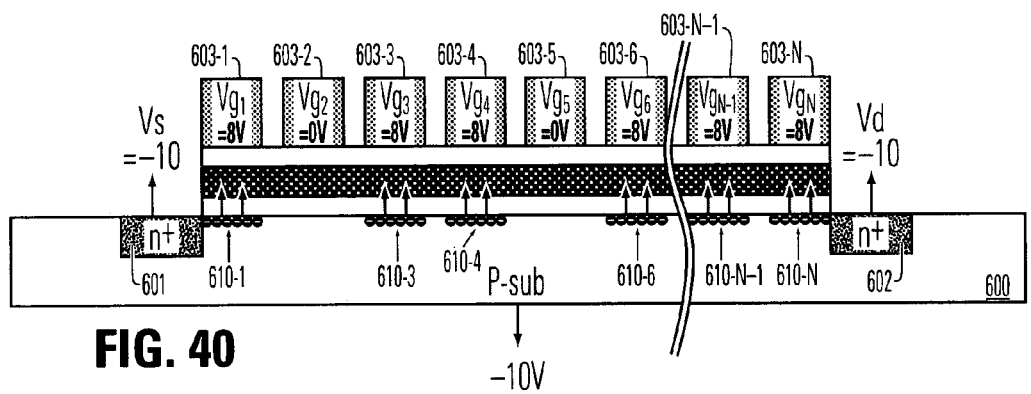
FIG. 40 illustrates a multiple-gate memory cell, having N control gates and two storage locations associated with each control gate, with a bias arrangement for erasing the data under selected control gates.
Figure 41:
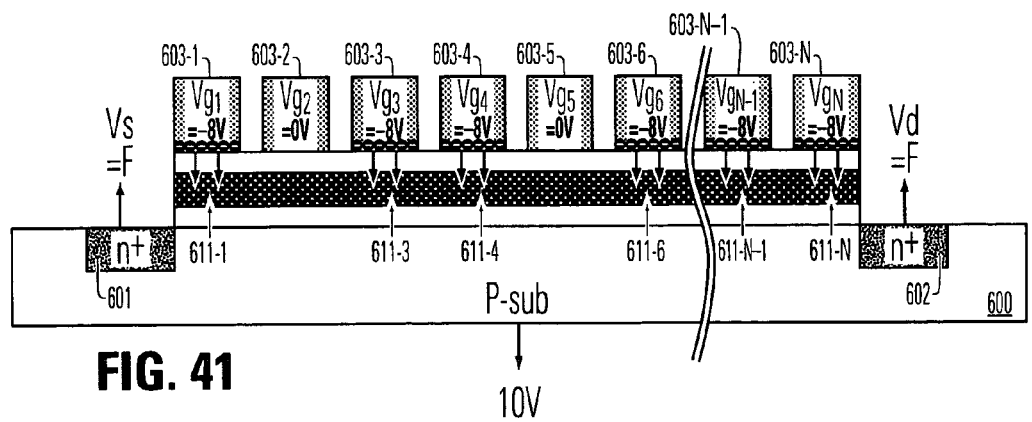
FIG. 41 illustrates a multiple-gate memory cell, having N control gates and two storage locations associated with each control gate, with an alternative bias arrangement for erasing the data under selected control gates.

Alternative erase bias arrangements are shown in FIGS. 40 and 41. In FIG. 40, a positive gate voltage FN tunneling bias arrangement is used for erasing charge storage locations beneath the selected dates in the multiple-gate memory cell. Thus, according to 30 the bias arrangement illustrated in FIG. 40, selected gates 603-1, 603-3, 603-4, 603-6, 603-N-1 and 603-N are erased by applying $Vg_1$, $Vg_3$, $Vg_4$, $Vg_6$, $Vg_{(N-1)}$ and $Vg_N$ of about +8 volts, $Vg_2$ and $Vg_5$ of about 0 volts, and Vs, Vd and Vb of about -10 volts. This bias arrangement induces electron tunneling from the substrate to the charge storage structure, as indicated by symbols 610-1, 610-3, 610-4, 610-6, 610-N-1 and 610-N beneath the selected gates 603-1, 603-3, 603-4, 603-6, 603-N-1 and 603-N. The electron tunneling causes an increase in threshold voltage to a target erase threshold state for both storage locations associated with each selected gate. The unselected gates 603-2 and 603-5 receive a gate voltage of about 0 volts, which is insufficient to induce tunneling of electrons sufficient to significantly disturb a previously established threshold state in the unselected memory cells.

FIG. 41 illustrates a negative gate voltage FN tunneling bias arrangement, as an alternative to the bias arrangement of FIG. 40. According to the bias arrangement illustrated in FIG. 40, selected gates 603-1, 603-3, 603-4, 603-6, 603-N-1 and 603-N are erased by applying $Vg_1$, $Vg_3$, $Vg_4$, $Vg_6$, $Vg_{(N-1)}$ and $Vg_N$ of about -8 volts, $Vg_2$ and $Vg_5$ of about 0 volts, and Vs, Vd and Vb of about +10 volts. This bias arrangement induces electron tunneling from the selected control gates 603-1, 603-3, 603-4, 603-6, 603-N-1 and 603-N to the charge storage structure, as indicated by symbols 611-1, 611-3, 611-4, 611-6, 611-N-1 and 611-N. The electron tunneling effects an increase in threshold voltage to a target erase threshold state for both storage locations associated with each selected gate. The unselected gates 603-2 and 603-5 receive a gate voltage of about 0 volts, which is insufficient to induce tunneling of electrons sufficient to significantly disturb a previously established threshold state in the unselected memory cells.

Figure 42:
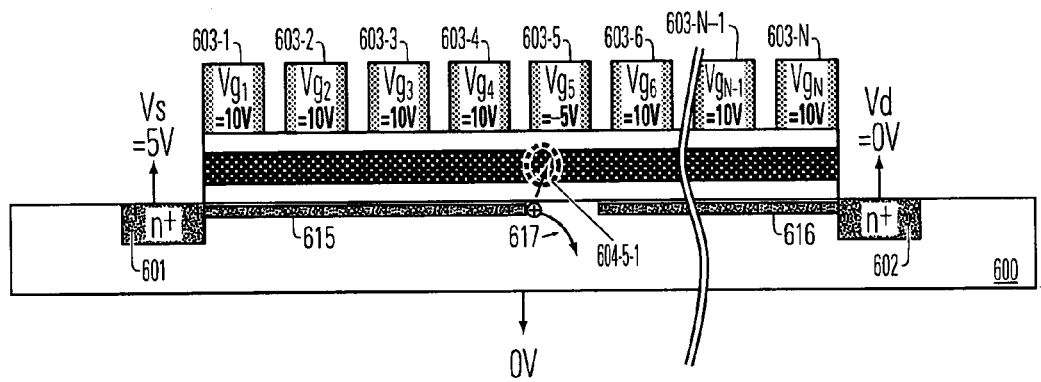
FIG. 42 illustrates a multiple-gate memory cell, having N control gates and two storage locations associated with each control gate, with a bias arrangement for programming a left side bit beneath a selected control gate.
Figure 43:
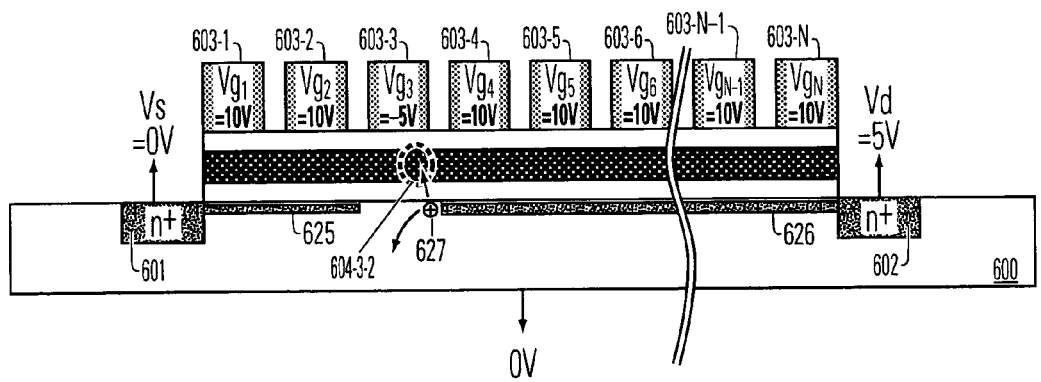
FIG. 43 illustrates a multiple-gate memory cell, having N control gates and two storage locations associated with each control gate, with a bias arrangement for programming the right side bit beneath a selected control gate.

FIGS. 42 and 43 illustrate left side and right side programming by band-to-band tunneling induced hot hole injection for the memory cell of FIG. 39. To program a storage location on a left side, for example the storage location 604-5-1 beneath gate 603-5, the bias arrangement illustrated in FIG. 42 is used. According to the bias arrangement of FIG. 42, the unselected gates 603-1 through 603-4 and 603-6 through 603-N receive a high voltage such as about +10 volts, while the selected gate 603-5 receives a $Vg_5$ of about -5 volts. The terminal 601 receives Vs equal to about +5 volts and the terminal 602 receives Vd equal to about 0 volts. Likewise, the substrate receives Vb of about 0 volts. The relatively high voltage on the unselected gates induces inversion regions 615 and 616 which couple the terminals 601 and 602 to the channel region beneath gate 603-5. Band-to-band tunneling induced hot holes as indicated by the symbol 617 are induced at the edge of the inversion region 615 beneath the control gate 603-5, and injected into the charge storage location 604-5-1, sufficient to lower the threshold voltage of the left side storage location associated with the selected gate 603-5 to a target program state.

FIG. 43 illustrates the bias arrangement for programming a right side storage location associated with a selected gate. To program a storage location on a right side, for example the storage location 604-3-2 beneath gate 603-3, the bias arrangement illustrated in FIG. 43 is used. According to the bias arrangement of FIG. 43, the unselected gates 603-1 through 603-2 and 603-4 through 603-N receive a high voltage such as about +10 volts, while the selected gate 603-3 receives a $Vg_3$ of about -5 volts. The terminal 601 receives Vs equal to about 0 volts and the terminal 602 receives Vd equal to about +5 volts. Likewise, the substrate receives Vb of about 0 volts. The relatively high voltage on the unselected gates induces inversion regions 625 and 626 which couple the terminals 601 and 602 to the channel region beneath gate 603-3. Band-to-band tunneling induced hot holes as indicated by the symbol 627 are induced at the edge of the inversion region 626 beneath the control gate 603-3, and injected into the charge storage location 604-3-2, sufficient to lower the threshold voltage of the right side storage location associated with the selected gate 603-3 to a target program state.

Figure 44:
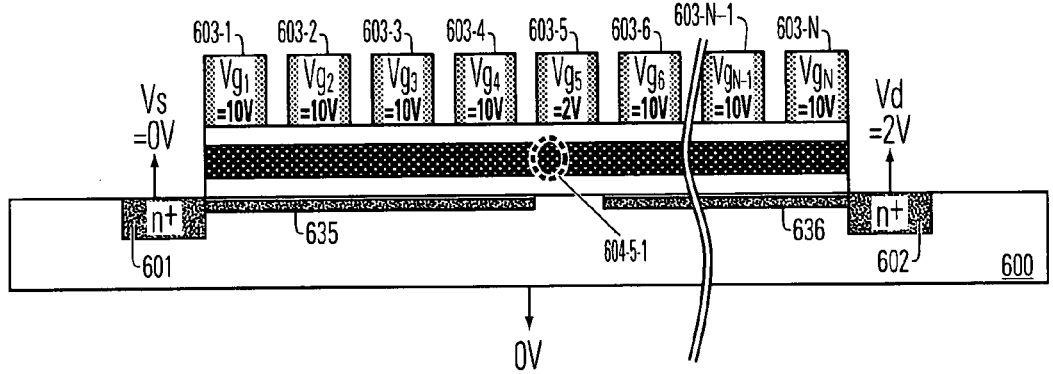
FIG. 44 illustrates a multiple-gate memory cell, having N control gates and two storage locations associated with each control gate, with a bias arrangement for reading a left side bit beneath a selected control gate.
Figure 45:
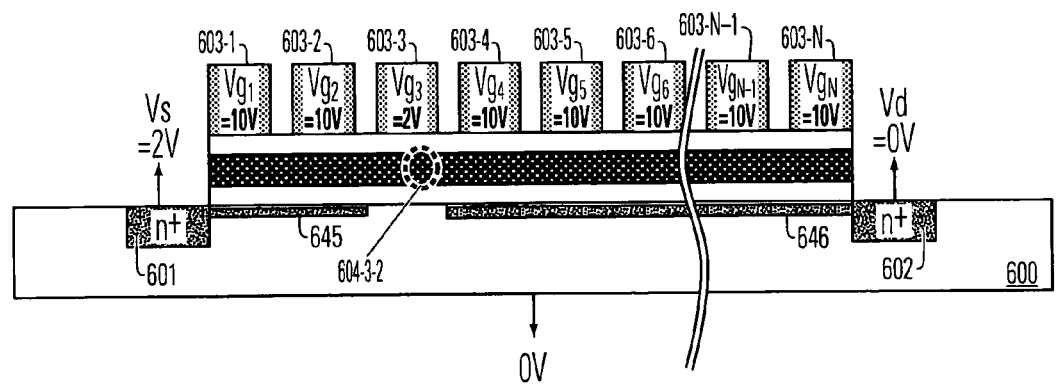
FIG. 45 illustrates a multiple-gate memory cell, having N control gates and two storage locations associated with each control gate, with a bias arrangement for reading the right side bit beneath a selected control gate.

FIGS. 44 and 45 illustrate left side and right side reverse read bias arrangements for the memory cell of FIG. 39. To read a storage location on a left side, for example the storage location 604-5-1 beneath gate 603-5, the bias arrangement illustrated in FIG. 44 is used. According to the bias arrangement of FIG. 44, the unselected gates 603-1 through 603-4 and 603-6 through 603-N receive a high voltage such as about +10 volts, while the selected gate 603-5 receives a $Vg_5$ of about +2 volts. The terminal 601 receives Vs equal to about 0 volts and the terminal 602 receives Vd equal to about +2 volts. Likewise, the substrate receives Vb of about 0 volts. The relatively high voltage on the unselected gates induces inversion regions 635 and 636 which couple the terminals 601 and 602 to the channel region beneath gate 603-5. If the charge storage location 604-5-1 has a high threshold state (erased), then current flow is blocked between the terminals 601 and 602. Alternatively, if the charge storage location 604-5-1 has a low threshold state (programmed), then current flow is caused between the terminals 601 and 602. The current flow can be sensed to indicate the data stored in the charge storage location 604-5-1.

To read a storage location on a left side, for example the storage location 604-3-2 beneath gate 603-3, the bias arrangement illustrated in FIG. 45 is used. According to the bias arrangement of FIG. 45, the unselected gates 603-1, 603-2 and 603-4 through 603-N receive a high voltage such as about +10 volts, while the selected gate 603-3 receives a $Vg_5$ of about +2 volts. The terminal 601 receives Vs equal to about +2 volts and the terminal 602 receives Vd equal to about 0 volts. Likewise, the substrate receives Vb of about 0 volts. The relatively high voltage on the unselected gates induces inversion regions 645 and 646 which couple the terminals 601 and 602 to the channel region beneath gate 603-3. If the charge storage location 604-3-2 has a high threshold state (erased), then current flow is blocked between the terminals 601 and 602. Alternatively, if the charge storage location 604-3-2 has a low threshold state (programmed), then current flow is caused between the terminals 601 and 602. The current flow can be sensed to indicate the data stored in the charge storage location 604-3-2.

FIGS. 46–52 illustrate schematically representative embodiments of array layouts for multiple-gate memory cells as described herein, using the symbol for the multiple-gate cell shown in FIG. 11. The array layouts illustrated can be used with a single bit per cell and multiple bits per cell embodiments, including embodiments where more than one bit is stored in each storage location associated with each control gate, as discussed in more detail above.

Figure 46:
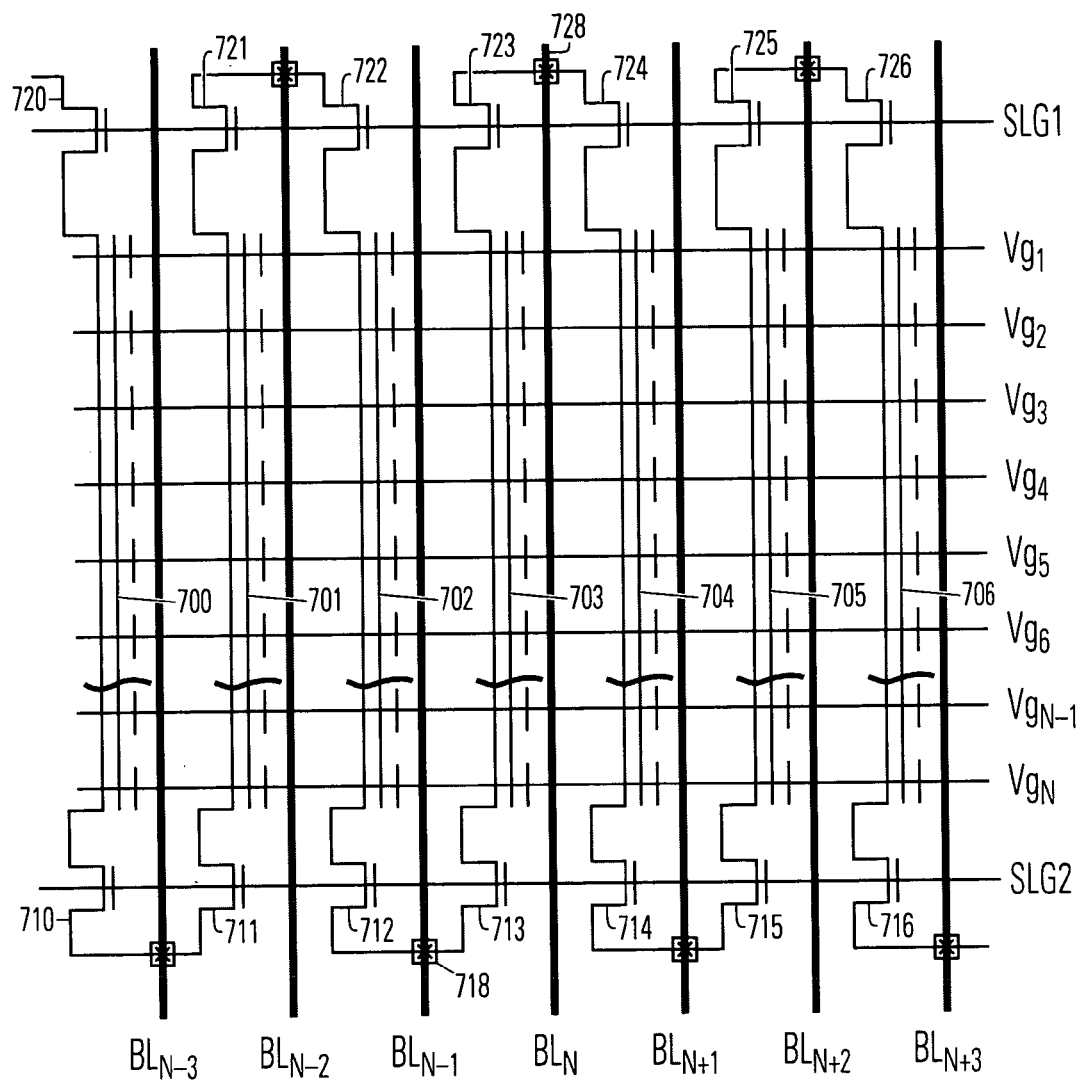
FIG. 46 is a schematic diagram of a layout for a sector of multiple-gate memory cells.

FIG. 46 illustrates a first layout embodiment, where multiple-gate memory cells 700–706, having the structure shown in FIG. 18, are laid out with bit lines $BL_{N-3}$ through $BL_{N+3}$. Word lines are arranged to deliver the bias voltages $Vg_1$ through $Vg_N$ in parallel to corresponding gates in the multiple-gate memory cells. The bit lines $BL_{N-3}$ through $BL_{N+3}$ are arranged to deliver one of the bias voltages Vs and Vd to bottom terminals of the multiple-gate memory cells 700–706 through select gates 710–716, respectively. The select gates 710–716 have their gates coupled to a bias line arranged in parallel with the word lines, and carrying control signal SLG2. Also, the bit lines $BL_{N-3}$ through $BL_{N+3}$ are arranged to deliver the other of the bias voltages Vs and Vd, to top terminals of the multiple-gate memory cells 700–706 through select gates 720–726, respectively. The select gates 720–726 have their gates coupled to a bias line arranged in parallel with the word lines, and carrying control signal SLG1. The bit lines $BL_{N-3}$ through $BL_{N+3}$ are typically implemented using a metal layer on the integrated circuit, and are coupled to the source or drain terminals of the select gates 710–716 or 720–726, using contact vias; such as contact vias 718 and 728. In the array layout illustrated, the multiple-gate memory cell 706 is coupled via select gates 716 and 726 to the bit lines $BL_{N+3}$ and $BL_{N+2}$, respectively. The multiple-gate memory cell 705 is coupled via select gates 715 and 725 to the bit lines $BL_{N+1}$ and $BL_{N+2}$, respectively. The multiple-gate memory cell 704 is coupled via select gates 714 and 724 to the bit lines $BL_{N+1}$ and $BL_N$, respectively. The multiple-gate memory cell 703 is coupled via select gates 713 and 723 to the bit lines $BL_{N-1}$ and $BL_N$, respectively. The multiple-gate memory cell 702 is coupled via select gates 712 and 722 to the bit lines $BL_{N-1}$ and $BL_{N-2}$, respectively. The multiple-gate memory cell 701 is coupled via select gates 711 and 721 to the bit lines $BL_{N-3}$ and $BL_{N-2}$, respectively. The multiple-gate memory cell 700 is coupled via select gates 710 and 720 to the bit lines $BL_{N-3}$ and $BL_{N-4}$ (not shown), respectively. In the embodiment of FIG. 46, the multiple-gate memory cells are arranged in parallel, and connection of a single multiple-gate memory cell to bit lines in the array is controlled by two select gates. The sources of two adjacent parallel cells are coupled together and to a single bit line. Likewise, the drains of two adjacent parallel cells are coupled together and to a single bit line.

Figure 47:
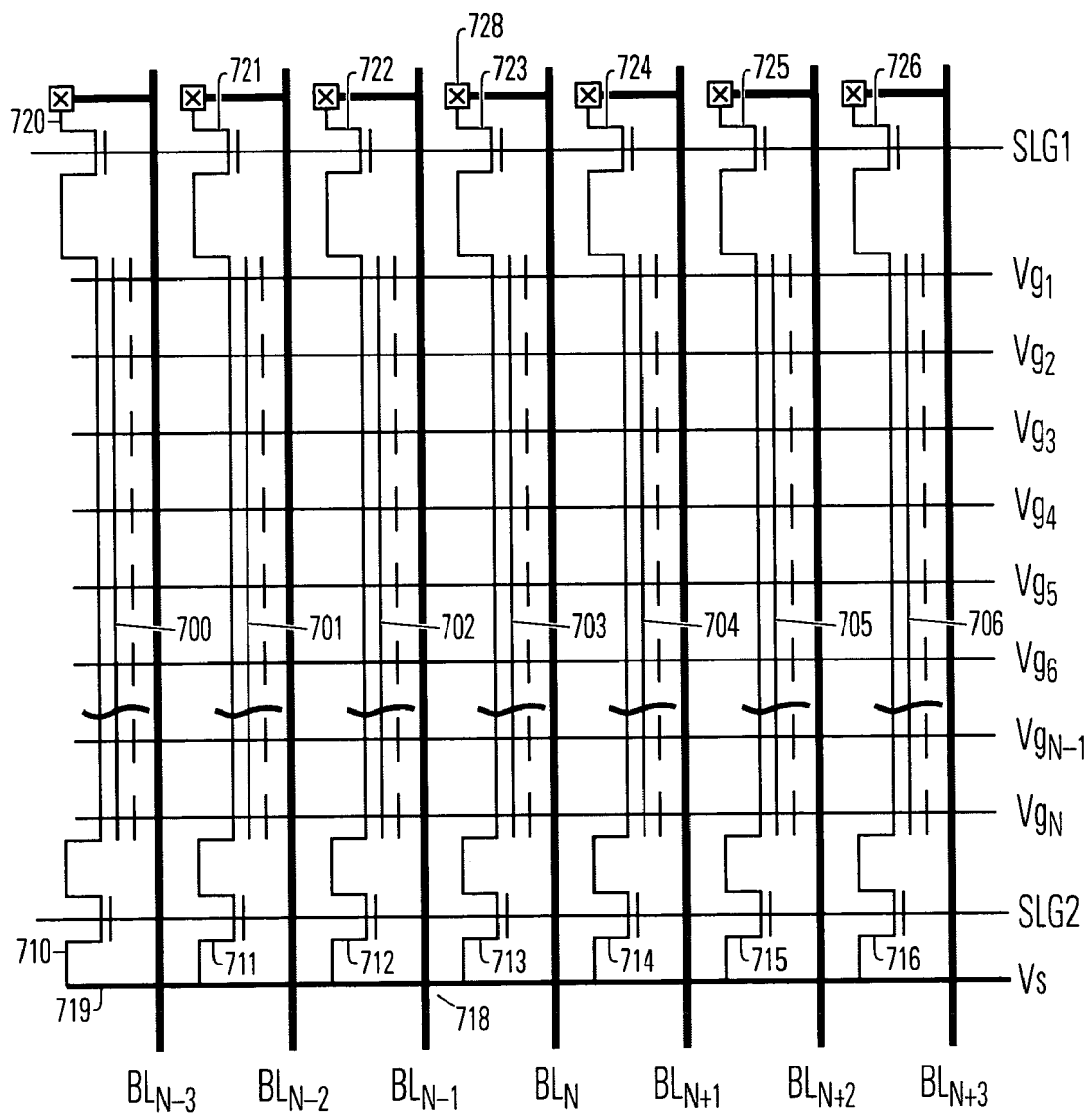
FIG. 47 is a schematic diagram of a first alternative layout for a sector of multiple-gate memory cells.

FIG. 47 illustrates an alternative layout embodiment, where multiple-gate memory cells 700–706, having the structure shown in FIG. 18, are laid out with bit lines $BL_{N-3}$ through $BL_{N+3}$. Word lines are arranged to deliver the bias voltages $Vg_1$ through $Vg_N$ in parallel to corresponding gates in the multiple-gate memory cells. The bit lines $BL_{N-3}$ through $BL_{N+3}$ are arranged to deliver the bias voltages Vd to the top terminals of the multiple-gate memory cells 700–706 through select gates 720–726, respectively. Also, a horizontal source line 719, implemented with buried doped regions or with metal layers, is arranged to deliver the bias voltage Vs to the bottom terminals of the multiple-gate memory cells 700–706 through select gates 710–716, respectively. The select gates 710–716 have their gates coupled to a bias line arranged in parallel with the word lines, and carrying control signal SLG2. The bit lines $BL_{N-3}$ through $BL_{N+3}$ are typically implemented using a metal layer on the integrated circuit, and are coupled to the drain terminals of the select gates 720–726, using contact vias, such as contact via 728. In the array layout illustrated, the multiple-gate memory cell 706 is coupled via select gates 716 and 726 to the bit line $BL_{N+3}$ and the source line 719, respectively. The multiple-gate memory cell 705 is coupled via select gate 725 to the bit line $BL_{N+2}$ and the source line 719, respectively. The multiple-gate memory cell 704 is coupled via select gate 724 to the bit line $BL_{N+1}$ and the source line 719, respectively. The multiple-gate memory cell 703 is coupled via select gate 723 to the bit line $BL_N$ and the source line 719, respectively. The multiple-gate memory cell 702 is coupled via select gate 722 to the bit line $BL_{N-1}$ and the source line 719, respectively. The multiple-gate memory cell 701 is coupled via select gate 721 to the bit line $BL_{N-2}$ and the source line 719, respectively. The multiple-gate memory cell 700 is coupled via select gate 720 to the bit line $BL_{N-3}$ and the source line 719, respectively. In the embodiment of FIG. 47, the sources of all of the parallel cells in the sector are coupled together, and to the horizontal source line, which is orthogonal to the bit line directions. The drain of each multiple-gate memory cell is coupled to a single bit line, which is not shared with adjacent bit lines.

Figure 48:
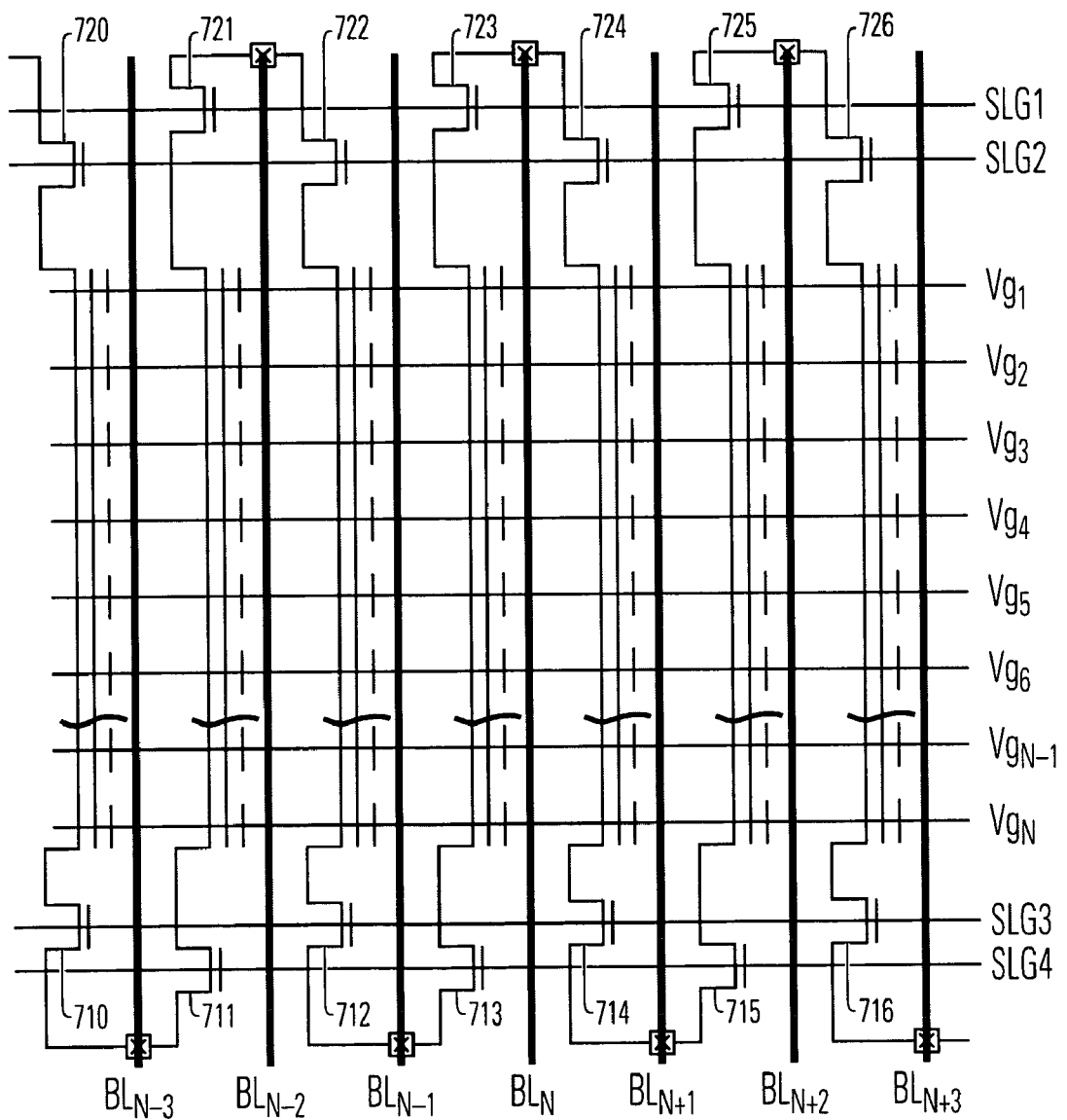
FIG. 48 is a schematic diagram of a second alternative layout for a sector of multiple-gate memory cells.

FIG. 48 illustrates another layout embodiment, similar to the layout of FIG. 46. In the embodiment of FIG. 48, the select gates 720–726 and 710–716 are arranged to provide a decoding function by which only one multiple-gate memory cell may be connected to a bit line at a time. In particular, the select gates 721, 723, 725 have their gates terminals coupled to the control signal SLG1, while the select gates 720, 722, 724, 726 have their gates coupled to the control signal SLG2. Likewise, the select gates 711, 713, 715 have their gate terminals coupled to the control signal SLG4, while the select gates 710, 712, 714, 716 have their gates coupled to the control signal SLG3. Otherwise the arrangement is similar to that described in FIG. 46. In the embodiment of FIG. 48, connection of the bit lines to a single multiple-gate memory cell is controlled by two select gates. The sources of two adjacent parallel cells are coupled together and to a single bit line. Likewise, the drains of two adjacent parallel cells are coupled together and to a single bit line. The select gates are controlled said the adjacent parallel cells are not connected to the shared bit line at the same time.

Figure 49:
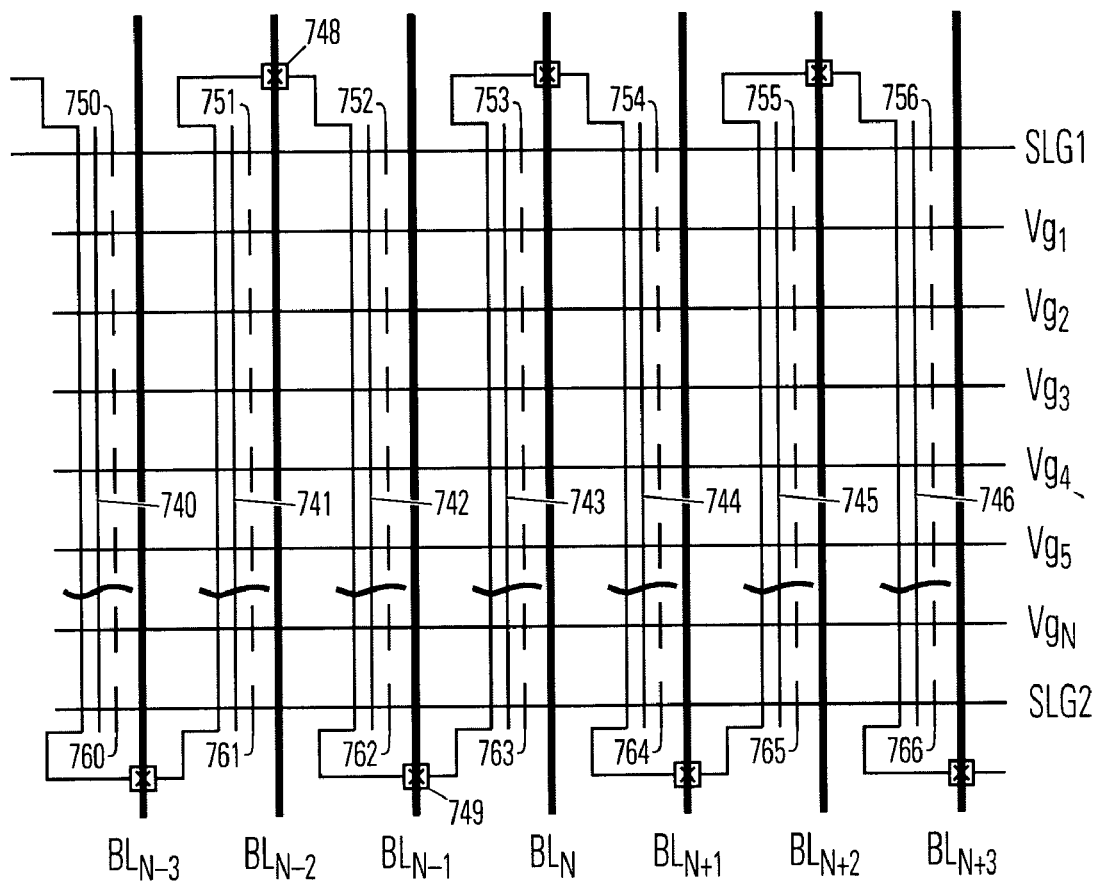
FIG. 49 is a schematic diagram of a third alternative layout for a sector of multiple-gate memory cells.

FIG. 49 illustrates a first layout embodiment, where multiple-gate memory cells 740–746, having the structure shown in FIG. 20, are laid out with bit lines $BL_{N-3}$ through $BL_{N+3}$. Word lines are arranged to deliver the bias voltages $Vg_1$ through $Vg_N$ in parallel to corresponding gates in the multiple-gate memory cells. The bit lines $BL_{N-3}$ through $BL_{N+3}$ are arranged to deliver one of the bias voltages Vs and Vd, to top terminals of the multiple-gate memory cells 740–746, respectively. The top control gates 750–756 in the multiple-gate memory cells are coupled to a bias line arranged in parallel with the word lines, and carrying control signal SLG1. Also, the bit lines $BL_{N-3}$ through $BL_{N+3}$ are arranged to deliver the other of the bias voltages Vs and Vd, to bottom terminals of the multiple-gate memory cells 740–746. The bottom control gates 760–766 are coupled to a bias line arranged in parallel with the word lines, and carrying control signal SLG2. The bit lines $BL_{N-3}$ through $BL_{N+3}$ are typically implemented using a metal layer on the integrated circuit, and are coupled to the source or drain terminals of the select gates 710–716 or 720–726, using contact vias, such as contact vias 748 and 749. In the array layout illustrated, the multiple-gate memory cell 746 is coupled in response to the signals SGL1 and SLG2 on its top and bottom control gates, to the bit lines $BL_{N+3}$ and $BL_{N+2}$, respectively. The multiple-gate memory cell 745 is coupled in response to the signals SGL1 and SLG2 on its top and bottom control gates, to the bit lines $BL_{N+1}$ and $BL_{N+2}$, respectively. The multiple-gate memory cell 744 is coupled in response to the signals SGL1 and SLG2 on its top and bottom control gates, to the bit lines $BL_{N+1}$ and $BL_N$, respectively. The multiple-gate memory cell 743 is coupled in response to the signals SGL1 and SLG2 on its top and bottom control gates, to the bit lines $BL_{N-1}$ and $BL_N$, respectively. The multiple-gate memory cell 742 is coupled in response to the signals SGL1 and SLG2 on its top and bottom control gates, to the bit lines $BL_{N-1}$ and $BL_{N-2}$, respectively. The multiple-gate memory cell 741 is coupled in response to the signals SGL1 and SLG2 on its top and bottom control gates, to the bit lines $BL_{N-3}$ and $BL_{N-2}$, respectively. The multiple-gate memory cell 740 is coupled in response to the signals SGL1 and SLG2 on its top and bottom control gates, to the bit lines $BL_{N-3}$ and $BL_{N-4}$ (not shown), respectively. The top and bottom control gates in each cell are operated to maintain the storage locations associated with them in a low threshold state, allowing them to be used instead of select gates, like select gates 710–716 and 720–726 in the array embodiment of FIG. 46. In the embodiment of FIG. 49, the multiple-gate memory cells are arranged in parallel, and connection of a single multiple-gate memory cell to bit lines in the array is controlled by two select gates. The sources of two adjacent parallel cells are coupled together and to a single bit line. Likewise, the drains of two adjacent parallel cells are coupled together and to a single bit line.

Figure 50:
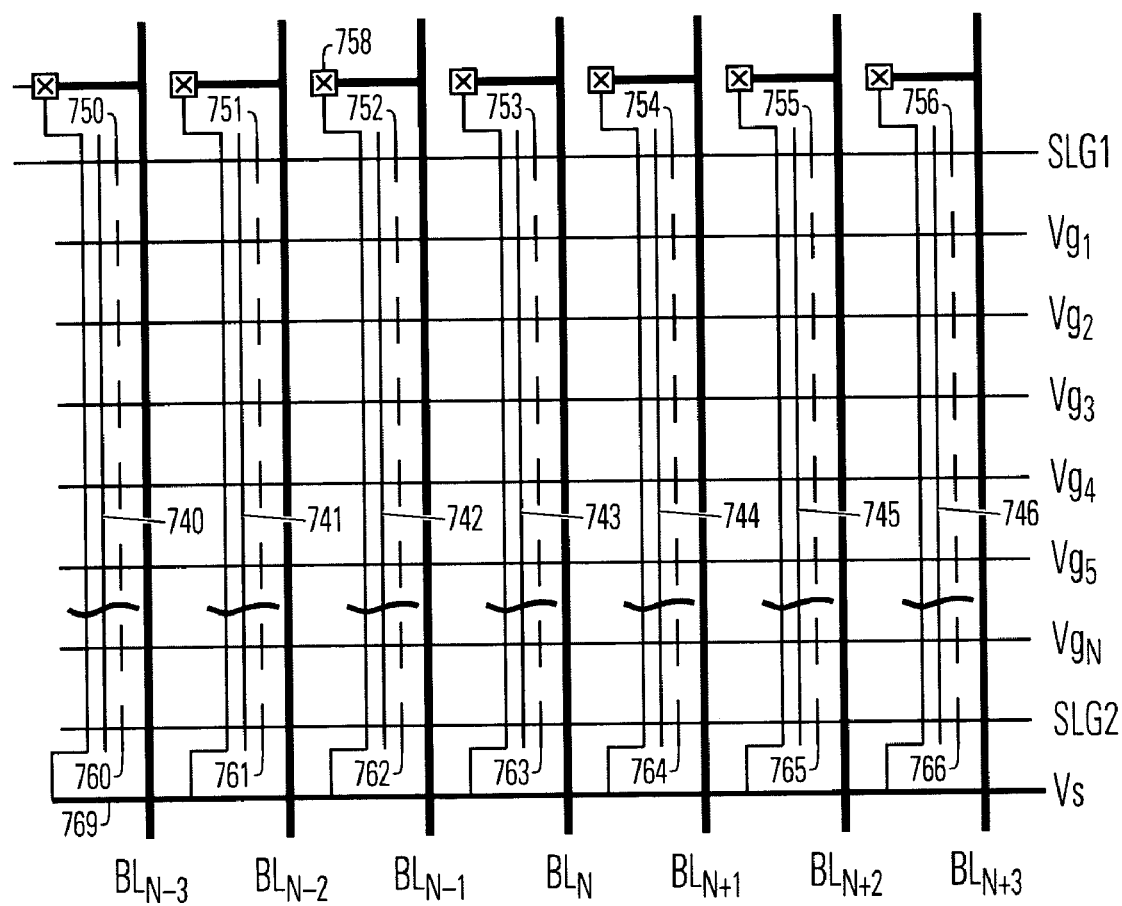
FIG. 50 is a schematic diagram of a fourth alternative layout for a sector of multiple-gate memory cells.

FIG. 50 illustrates a first layout embodiment, where multiple-gate memory cells 740–746 having the structure shown in FIG. 20, are laid out with bit lines $BL_{N-3}$ through $BL_{N+3}$. Word lines are arranged to deliver the bias voltages $Vg_1$ through $Vg_N$ in parallel to corresponding gates in the multiple-gate memory cells. The bit lines $BL_{N-3}$ through $BL_{N+3}$ are arranged to deliver the bias voltage Vd to top terminals of the multiple-gate memory cells 740–746, respectively. The top control gates 750–756 in the multiple-gate memory cells are coupled to a bias line arranged in parallel with the word lines, and carrying control signal SLG1. Also, a horizontal source line 769, implemented with buried doped regions or with metal layers, is arranged to deliver the bias voltages Vs to bottom terminals of the multiple-gate memory cells 740–746. The bottom control gates 760–766 are coupled to a bias line arranged in parallel with the word lines, and carrying control signal SLG2. The bit lines $BL_{N-3}$ through $BL_{N+3}$ are typically implemented using a metal layer on the integrated circuit, and are coupled to the drain terminals of the multiple-gate memory cells, using contact vias, such as contact via 758. In the array layout illustrated, the multiple-gate memory cell 746 is coupled in response to the signals SGL1 and SLG2 on its top and bottom control gates, to the bit line $BL_{N+3}$ and the source line 769, respectively. The multiple-gate memory cell 745 is coupled in response to the signals SGL1 and SLG2 on its top and bottom control gates, to the bit line $BL_{N+2}$ and the source line 769, respectively. The multiple-gate memory cell 744 is coupled in response to the signals SGL1 and SLG2 on its top and bottom control gates, to the bit line $BL_{N+1}$ and the source line 769, respectively. The multiple-gate memory cell 743 is coupled in response to the signals SGL1 and SLG2 on its top and bottom control gate to the bit line $BL_N$ and the source line 769, respectively. The multiple-gate memory cell 742 is coupled in response to the signals SGL1 and SLG2 on its top and bottom control gates to the bit lines $BL_{N-1}$ and the source line 769, respectively. The multiple-gate memory cell 741 is coupled in response to the signals SGL1 and SLG2 on its top and bottom control gates to the bit lines $BL_{N-2}$ and the source line 769, respectively. The multiple-gate memory cell 740 is coupled in response to the signals SGL1 and SLG2 on its top and bottom control gates to the bit lines $BL_{N-3}$ and the source line 769, respectively. The top and bottom control gates in each cell are operated to maintain the storage locations associated with them in a low threshold state, allowing them to be used instead of select gates, like select gates 710–716 and 720–726 in the array embodiment of FIG. 47. In the embodiment of FIG. 50, the sources of all of the parallel cells in the sector are coupled together, and to the horizontal source line, which is orthogonal to the bit line directions. The drain of each multiple-gate memory cell is coupled to a single bit line, which is not shared with adjacent bit lines.

Figure 51:
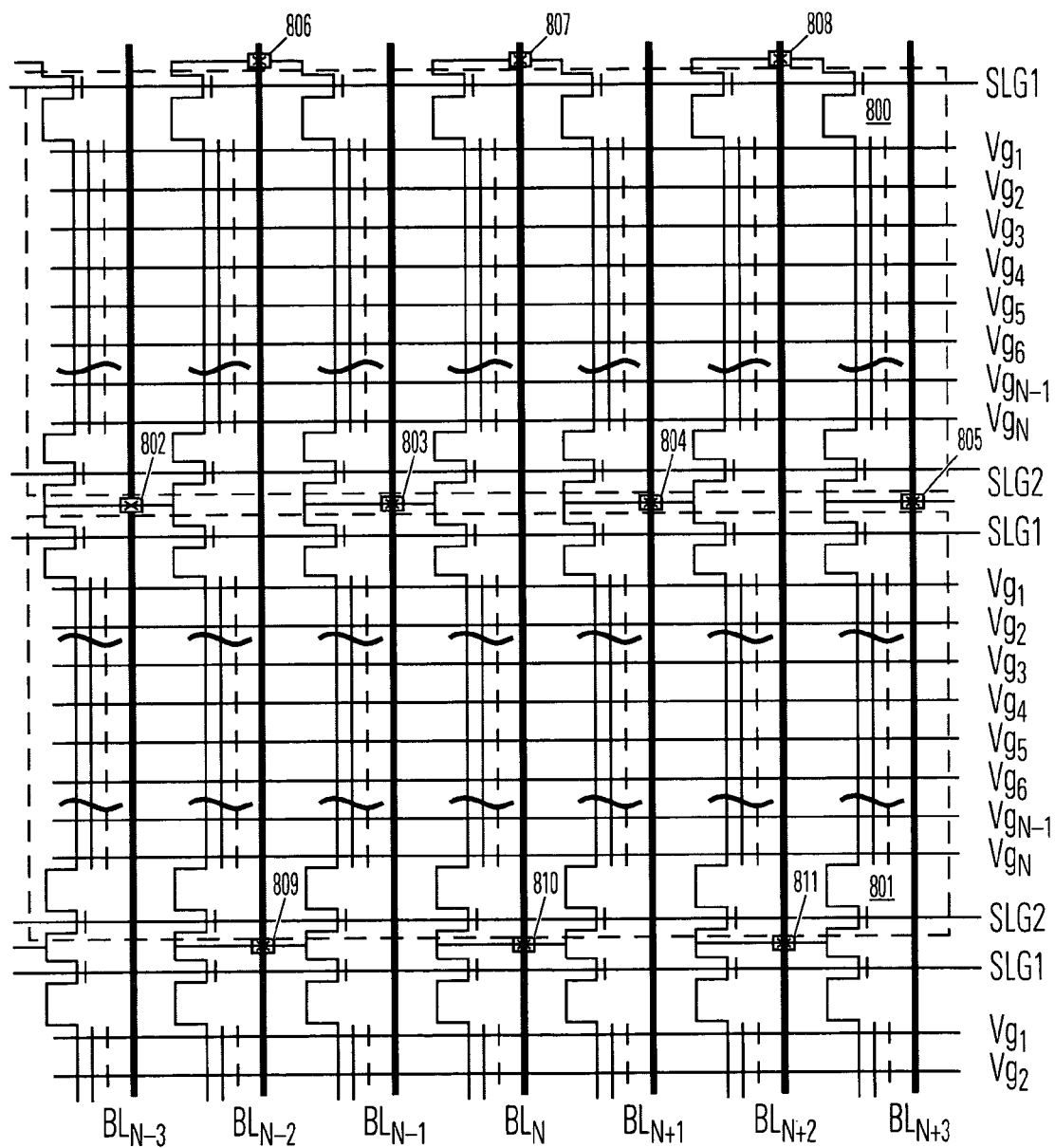
FIG. 51 illustrates a layout for a block of multiple-gate memory cells, including a plurality of sectors.

FIG. 51 illustrates the layout of a memory block comprising multiple sectors of multiple-gate memory cells, like the sector illustrated in FIG. 46. The layout can be utilized for the sector structures illustrated in FIGS. 47–50 as well. In FIG. 51, a first sector 800 and a second sector 801 are illustrated. The first sector 800 and the second sector 801 share contacts 802, 803, 804, 805 between them. The first sector 800 shares contacts 806, 807, 808 with a sector above it, which has an identical layout. Likewise, the second sector shares contacts 809, 810, 811 with a sector below it, which has an identical layout. The sectors are repeated to form a memory block, and the blocks are repeated to form a large array on an integrated circuit. In an alternative embodiment, the first sector 800 and the second sector 801 can be laid out in a mirror image fashion, around the shared contacts. An array including a plurality of memory blocks as shown in FIG. 51 is utilized in a high-density memory device, such as illustrated in FIG. 27.

Although there is only one multiple-gate memory cell between each select gate pair in the embodiments illustrated in FIGS. 46–48 and 51, other embodiments include more than one multiple-gate memory cell between select gates. Likewise, FIGS. 48 and 49 illustrate arrays having a single multiple-gate memory cell in series between contacts to the bit lines, or to the bit line in the horizontal source line. In other embodiments there can be multiple multiple-gate memory cells in series, with the top gate of the top multiple-gate memory cell in the series acting as the top select gate, and the bottom gate of the bottom multiple-gate memory cell in the series acting as the bottom select gate.

The technology described herein provides high-density memory, capable of storing multiple bits per cell, which can be manufactured using simple processes. In addition, the program and erase operations can be accomplished with relatively low power.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An integrated circuit memory device, comprising:
   a semiconductor body;
   a plurality of gates arranged in series on the semiconductor body, the plurality of gates including a first gate in the series and a last gate in the series, with insulating members isolating gates in the series from adjacent gates in the series;
   a charge storage structure on the semiconductor body, the charge storage structure including charge trapping locations beneath more than one of the plurality of gates in the series;
   circuitry to conduct source and drain bias voltages to the semiconductor body near the first gate and near the last gate in the series; and
   circuitry to conduct gate bias voltages to the plurality of gates;
   wherein the semiconductor body includes a continuous, multiple-gate channel region beneath the plurality of gates in the series, the multiple-gate channel region having one of n-type and p-type conductivity; and including
   a controller which controls the circuitry to conduct source and drain bias voltages and the circuitry to conduct gate bias voltages to establish bias arrangements for storing data in two charge trapping locations beneath each of said more than one of the plurality of gates in the series.

2. The device of claim 1, including two charge trapping locations beneath all the gates in the series.

3. The device of claim 1, wherein the circuitry to conduct source and drain bias voltages comprises conductive material arranged as bit lines, and the circuitry to conduct gate bias voltages comprises conductive material arranged as word lines.

4. The device of claim 1, wherein the circuitry to conduct source and drain bias voltages comprises conductive material arranged as bit lines, a first terminal location in the semiconductor body adjacent the first gate in the series and a second terminal location in the semiconductor body adjacent the last gate in the series, and wherein the first and second terminal locations have the other of n-type and p-type conductivity; and a device adapted to selectively connect at least one of the first and second terminal locations to the bit lines.

5. The device of claim 1, wherein the circuitry to conduct source and drain bias voltages to the semiconductor body comprises a first terminal location in the semiconductor body adjacent the first gate in the series and a second terminal location in the semiconductor body adjacent the last gate in the series, and wherein the first and second terminal locations have the other of n-type and p-type conductivity.

6. The device of claim 1, wherein the circuitry to conduct source and drain bias voltages comprises a bit line, including an additional gate adjacent the first gate in the series and over the multiple-gate channel region, the additional gate coupled to decoding circuitry and coupling the multiple-gate channel region to the bit line when selected.

7. The device of claim 1, wherein the circuitry to conduct source and drain bias voltages comprises first and second bit lines, including a first additional gate adjacent the first gate in the series and over the multiple-gate channel region, and a second additional gate adjacent the last gate in the series and over the multiple-gate channel region, the first and second additional gates being coupled to decoding circuitry and coupling the multiple-gate channel region to the first and second bit lines when selected.

8. The device of claim 1, wherein the charge storage structure comprises a dielectric stack including a bottom dielectric layer, a charge trapping dielectric layer and a top dielectric layer.

9. The device of claim 1, wherein the charge storage structure comprises a dielectric stack including a bottom dielectric layer, a charge trapping dielectric layer and a top dielectric layer, and wherein the charge trapping dielectric layer comprises silicon nitride.

10. The device of claim 1, wherein the series of gates includes more than two gates, and the charge storage structure includes charge trapping locations beneath more than two gates in the series of gates.

11. The device of claim 1, wherein the controller applies a program procedure, an erase procedure and a read procedure, and wherein the program procedure includes establishing a low threshold state, and the erase procedure includes establishing a high threshold state.

12. An integrated circuit memory device, comprising:
   a semiconductor body;
   a plurality of word lines extending across the semiconductor body;
   a plurality of bit lines arranged generally orthogonally to the plurality of word lines across the semiconductor body;
   decoding circuitry on the semiconductor body, and coupled to the plurality of word lines and the plurality of bit lines;
   an array of multiple-gate storage elements coupled to the plurality of word lines and the plurality of bit lines, the multiple-gate storage elements respectively including:
      a plurality of gates arranged in a series and coupled to respective word lines in the plurality of word lines, the plurality of gates including a first gate in the series and a last gate in the series, with insulating members isolating gates in the series from adjacent gates in the series;
      a charge storage structure on the semiconductor body, the charge storage structure including charge trapping locations beneath more than one of the plurality of gates in the series;
      a continuous, multiple-gate channel region beneath the plurality of gates in the series, the multiple-gate channel region having one of n-type and p-type conductivity;
      source and drain terminals near the first and last gates in the series, at least one of the source and drain terminals being coupled to a bit line in the plurality of bit lines; and
   a controller which controls the circuitry to conduct source and drain bias voltages and the circuitry to conduct gate bias voltages to establish bias arrangements for storing data in two charge trapping locations beneath each of said more than one of the plurality of gates in the series, the controller being arranged to control a program procedure, an erase procedure and a read procedure for the two storage locations beneath each of said more than one of the plurality of gates in the series.

13. The device of claim 12, including two charge trapping locations beneath all the gates in the series.

14. The device of claim 12, wherein the source terminal comprises a first terminal location in the semiconductor body adjacent the first gate in the series and the drain terminal comprises a second terminal location in the semiconductor body adjacent the last gate in the series, and wherein the first and second terminal locations have the other of n-type and p-type conductivity.

15. The device of claim 12, wherein the source terminal comprises a first terminal location in the semiconductor body adjacent the first gate in the series, and the drain terminal comprises a second terminal location in the semiconductor body adjacent the last gate in the series, and wherein the first and second terminal locations have the other of n-type and p-type conductivity; and including a device coupled to the decoding circuitry adapted to selectively connect at least one of the first and second terminal locations to the bit lines.

16. The device of claim 12, wherein the multiple-gate storage elements respectively include an additional gate adjacent the first gate in the series and over the multiple-gate channel region, the additional gate coupled to the decoding circuitry and coupling the multiple-gate channel region to one of the source and drain terminals when selected.

17. The device of claim 12, wherein the charge storage structure comprises a dielectric stack including a bottom dielectric layer, a charge trapping dielectric layer and a top dielectric layer.

18. The device of claim 12, wherein the charge storage structure comprises a dielectric stack including a bottom dielectric layer, a charge trapping dielectric layer and a top dielectric layer, and wherein the charge trapping dielectric layer comprises silicon nitride.

19. The device of claim 12, wherein the program procedure includes establishing a bias arrangement for multiple-gate storage elements in the array, the bias arrangement inducing hole injection tunneling into one of the two charge trapping locations beneath a selected gate in the series.

20. The device of claim 12, wherein the read procedure includes establishing a bias arrangement for multiple-gate storage elements in the array, the bias arrangement including applying source, drain and gate voltages which induce current flow in response to a threshold voltage in one of the two charge trapping locations beneath a selected gate in the series.

21. The device of claim 12, wherein the erase procedure includes establishing a bias arrangement for multiple-gate storage elements in the array, the bias arrangement inducing electron injection tunneling into the two charge trapping locations beneath one or more gates in the series.

22. The device of claim 12, wherein the series of gates includes more than two gates, and the charge storage structure includes two charge trapping locations beneath more than two gates in the series of gates.

23. A method for operating an integrated circuit memory device, the device comprising, a semiconductor body, a plurality of gates arranged in series on the semiconductor body, the plurality of gates including a first gate in the series and a last gate in the series, with insulating members isolating gates in the series from adjacent gates in the series, a charge storage structure on the semiconductor body, the charge storage structure including charge trapping locations beneath more than one of the plurality of gates in the series, wherein the semiconductor body includes a continuous, multiple-gate channel region beneath the plurality of gates in the series, the multiple-gate channel region having one of n-type and p-type conductivity; the method comprising applying a bias arrangement for programming data at a selected gate, the bias arrangement for programming a selected charge trapping location beneath a selected gate in the series, including:
  applying a substrate bias condition to the semiconductor body in the multiple-gate channel region;
  applying a source bias condition to the semiconductor body near one of the first and last gates in the series;
  applying a drain bias condition to the semiconductor body near another of the first and last gates in the series; and
  applying gate bias conditions to the plurality of gates in the series, wherein the gate bias conditions include a program voltage relative to the substrate bias condition on a selected gate in the series, and the source and drain bias conditions include source and drain voltages is the semiconductor body, sufficient to induce hole injection current into the one of the two charge trapping locations beneath the selected gate to establish a low threshold state, and inversion voltages on other gates in the series sufficient to induce inversion in the multiple-gate channel region beneath said other gates without significant electron or hole injection into charge storage locations beneath said other gates, for conduction of the source and drain bias voltages to the region beneath the selected gate.

24. The method of claim 23, further comprising applying a bias arrangement for reading including:
  applying a substrate bias condition to the semiconductor body in the multiple-gate channel region;
  applying a source bias condition to the semiconductor body near one of the first and last gates in the series;
  applying a drain bias condition to the semiconductor body near another of the first and last gate in the series; and
  applying gate bias conditions to the plurality of gates in the series, wherein the gate bias conditions include a read voltage relative to the substrate bias condition on a selected gate in the series, the read voltage being higher than a threshold voltage for the low threshold state, and inversion voltages on other gates in the series sufficient to induce inversion in the multiple-gate channel region beneath said other gates, the inversion voltages higher than the high threshold state.

25. The method of claim 24, further comprising applying a bias arrangement for erasing including:
  applying a substrate bias condition to the semiconductor body in the multiple-gate channel region;
  applying a source bias condition to the semiconductor body near one of the first and last gates in the series;
  applying a drain bias condition to the semiconductor body near another of the first and last gates in the series; and
  applying gate bias conditions to the plurality of gates in the series, wherein the gate bias conditions include voltages sufficient to induce electron injection to the charge trapping locations beneath one or more gates in the series to establish the high threshold state.

* * * * *